United States Patent
Yeo

(10) Patent No.: US 10,411,084 B2
(45) Date of Patent: *Sep. 10, 2019

(54) FLEXIBLE DISPLAY DEVICE PROVIDING STRUCTURES TO MINIMIZE FAILURE GENERATED IN BENT PORTION

(71) Applicant: LG DISPLAY CO., LTD., Seoul (KR)

(72) Inventor: JunHo Yeo, Chilgok-gun (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/849,398

(22) Filed: Dec. 20, 2017

(65) Prior Publication Data

US 2018/0182838 A1    Jun. 28, 2018

(30) Foreign Application Priority Data

Dec. 26, 2016 (KR) .................. 10-2016-0178884

(51) Int. Cl.
*H01L 27/32* (2006.01)
*H01L 51/00* (2006.01)
*H01L 51/52* (2006.01)

(52) U.S. Cl.
CPC ...... *H01L 27/3279* (2013.01); *H01L 27/3288* (2013.01); *H01L 51/0097* (2013.01); *H01L 51/5253* (2013.01); *H01L 27/323* (2013.01); *H01L 27/3272* (2013.01); *H01L 2227/323* (2013.01); *H01L 2251/5338* (2013.01); *Y02E 10/549* (2013.01)

(58) Field of Classification Search
CPC .................. H01L 27/3279; H01L 51/0097
See application file for complete search history.

(56) References Cited

U.S. PATENT DOCUMENTS

| | | |
|---|---|---|
| 4,066,855 A | 1/1978 | Zenk |
| 4,085,302 A | 4/1978 | Zenk et al. |
| 4,958,205 A | 9/1990 | Takeda et al. |
| 5,075,237 A | 12/1991 | Wu |
| 5,235,451 A | 8/1993 | Bryan |

(Continued)

FOREIGN PATENT DOCUMENTS

| | | |
|---|---|---|
| EP | 1 801 647 A1 | 6/2007 |
| EP | 2 187 443 A2 | 5/2010 |

(Continued)

OTHER PUBLICATIONS

International Search Report and Written Opinion, dated Jun. 5, 2014, for International Application No. PCT/US2013/066156, 16 pages.

(Continued)

*Primary Examiner* — Quoc D Hoang
(74) *Attorney, Agent, or Firm* — Seed IP Law Group LLP

(57) ABSTRACT

Disclosed is a flexible display device. The flexible display device includes a base layer including a first portion in which an organic light emitting diode is disposed on a first surface and a second portion which has a bended section bent toward a second surface which is opposite to the first surface at the outside of the first portion; and conductive lines in the bended section, the conductive lines are disposed on two or more layers, and the conductive lines extend in a direction which is not parallel to a bending direction of the bended section.

13 Claims, 15 Drawing Sheets

(56) References Cited

U.S. PATENT DOCUMENTS

| | | |
|---|---|---|
| 5,483,261 A | 1/1996 | Yasutake |
| 5,488,204 A | 1/1996 | Mead et al. |
| 5,592,199 A | 1/1997 | Kawaguchi et al. |
| 5,717,556 A | 2/1998 | Yanagida |
| 5,825,352 A | 10/1998 | Bisset et al. |
| 5,835,079 A | 11/1998 | Shieh |
| 5,880,411 A | 3/1999 | Gillespie et al. |
| 5,990,492 A | 11/1999 | Kim |
| 6,037,017 A | 3/2000 | Kashiro |
| 6,104,464 A | 8/2000 | Adachi et al. |
| 6,188,391 B1 | 2/2001 | Seely et al. |
| 6,310,610 B1 | 10/2001 | Beaton et al. |
| 6,323,846 B1 | 11/2001 | Westerman et al. |
| 6,372,636 B1 | 4/2002 | Chooi et al. |
| 6,500,701 B2 | 12/2002 | Higashi et al. |
| 6,690,387 B2 | 2/2004 | Zimmerman et al. |
| 6,803,245 B2 | 10/2004 | Auch et al. |
| 6,869,825 B2 | 3/2005 | Chiu |
| 6,882,398 B2 | 4/2005 | Watanabe et al. |
| 6,927,344 B1 | 8/2005 | Gall et al. |
| 6,956,633 B2 | 10/2005 | Okada et al. |
| 6,970,219 B1 | 11/2005 | Hermann |
| 7,015,894 B2 | 3/2006 | Morohoshi |
| 7,034,913 B2 | 4/2006 | Ishida |
| 7,184,064 B2 | 2/2007 | Zimmerman et al. |
| 7,221,012 B2 | 5/2007 | Chu et al. |
| 7,258,549 B2 | 8/2007 | Asahi et al. |
| 7,453,542 B2 | 11/2008 | Muramatsu et al. |
| 7,465,678 B2 | 12/2008 | Bhattacharya et al. |
| 7,476,896 B2 | 1/2009 | Choi et al. |
| 7,495,736 B2 | 2/2009 | Chen et al. |
| 7,541,671 B2 | 6/2009 | Foust et al. |
| 7,593,086 B2 | 9/2009 | Jeong et al. |
| 7,593,087 B2 | 9/2009 | Jang |
| 7,663,607 B2 | 2/2010 | Hotelling et al. |
| 7,767,502 B2 | 8/2010 | Kim et al. |
| 7,787,917 B2 | 8/2010 | Aoki et al. |
| 7,834,451 B2 | 11/2010 | Lee et al. |
| 7,843,041 B2 | 11/2010 | Kodaira et al. |
| 7,936,405 B2 | 5/2011 | Kitagawa |
| 8,003,986 B2 | 8/2011 | Teng et al. |
| 8,039,838 B2 | 10/2011 | Heitzinger et al. |
| 8,106,309 B2 | 1/2012 | Hwang |
| 8,113,902 B2 | 2/2012 | Kang et al. |
| 8,134,675 B2 | 3/2012 | Kawaguchi et al. |
| 8,194,048 B2 | 6/2012 | Oowaki |
| 8,203,261 B2 | 6/2012 | Tanaka et al. |
| 8,319,725 B2 | 11/2012 | Okamoto et al. |
| 8,373,181 B2 | 2/2013 | Aurongzeb et al. |
| 8,434,909 B2 | 5/2013 | Nichol et al. |
| 8,471,995 B2 | 6/2013 | Tseng et al. |
| 8,716,932 B2 | 5/2014 | Rappoport et al. |
| 8,723,824 B2 | 5/2014 | Myers et al. |
| 8,724,304 B2 | 5/2014 | Raff et al. |
| 8,787,016 B2 | 7/2014 | Rothkopf et al. |
| 8,804,347 B2 | 8/2014 | Martisauskas |
| 8,816,977 B2 | 8/2014 | Rothkopf et al. |
| 8,929,085 B2 | 1/2015 | Franklin et al. |
| 8,934,228 B2 | 1/2015 | Franklin et al. |
| 8,947,627 B2 | 2/2015 | Rappoport et al. |
| 9,098,242 B2 | 8/2015 | Rappoport et al. |
| 9,110,320 B2 | 8/2015 | Chen et al. |
| 9,276,055 B1 * | 3/2016 | Son ............... H01L 27/3276 |
| 9,349,758 B2 * | 5/2016 | Ki ................. H01L 29/78672 |
| 9,379,355 B1 * | 6/2016 | Lee ............... H01L 51/5253 |
| 9,425,418 B2 * | 8/2016 | Kwon ............ H01L 27/3276 |
| 9,600,112 B2 * | 3/2017 | Zhang ............ G06F 1/169 |
| 9,601,557 B2 | 3/2017 | Yang et al. |
| 9,716,932 B2 | 7/2017 | Miller et al. |
| 9,780,157 B2 * | 10/2017 | Kwon ............ H01L 27/3276 |
| 2001/0035572 A1 | 11/2001 | Isaak |
| 2002/0047978 A1 | 4/2002 | Fukuta et al. |
| 2003/0173663 A1 | 9/2003 | Kami et al. |
| 2004/0063001 A1 | 4/2004 | Wu et al. |
| 2004/0113250 A1 | 6/2004 | Khandros et al. |
| 2004/0119787 A1 | 6/2004 | Mori |
| 2004/0161010 A1 | 8/2004 | Matsumura |
| 2005/0012199 A1 | 1/2005 | Rosenau et al. |
| 2005/0140273 A1 | 6/2005 | Guo et al. |
| 2005/0285990 A1 | 12/2005 | Havelka et al. |
| 2006/0026521 A1 | 2/2006 | Hotelling et al. |
| 2006/0043318 A1 | 3/2006 | Kodera |
| 2006/0061241 A1 | 3/2006 | Sasaki |
| 2006/0192277 A1 | 8/2006 | RaghuRam |
| 2006/0197753 A1 | 9/2006 | Hotelling |
| 2006/0283212 A1 | 12/2006 | Wilson |
| 2007/0001282 A1 | 1/2007 | Kang et al. |
| 2007/0080433 A1 | 4/2007 | Lai |
| 2007/0090506 A1 | 4/2007 | Sundstrom |
| 2007/0148831 A1 | 6/2007 | Nagata et al. |
| 2007/0173031 A1 | 7/2007 | Kodaira et al. |
| 2008/0117376 A1 | 5/2008 | Takenaka |
| 2008/0129761 A1 | 6/2008 | Kim et al. |
| 2008/0158498 A1 | 7/2008 | Chang et al. |
| 2008/0185705 A1 | 8/2008 | Osborn et al. |
| 2008/0241549 A1 | 10/2008 | Seon et al. |
| 2008/0248191 A1 | 10/2008 | Daniels |
| 2009/0001380 A1 | 1/2009 | Yang et al. |
| 2009/0027896 A1 | 1/2009 | Nishimura et al. |
| 2009/0051640 A1 | 2/2009 | Tanaka et al. |
| 2009/0148678 A1 | 6/2009 | Hwang |
| 2009/0167171 A1 | 7/2009 | Jung et al. |
| 2009/0201635 A1 | 8/2009 | Kim et al. |
| 2009/0256471 A1 | 10/2009 | Kim et al. |
| 2009/0284688 A1 | 11/2009 | Shiraishi et al. |
| 2010/0007817 A1 | 1/2010 | Kim |
| 2010/0026952 A1 | 2/2010 | Miura et al. |
| 2010/0044685 A1 | 2/2010 | Kim et al. |
| 2010/0225624 A1 | 9/2010 | Fu et al. |
| 2010/0226103 A1 | 9/2010 | Muro et al. |
| 2010/0302478 A1 | 12/2010 | Nakagawa et al. |
| 2010/0315399 A1 | 12/2010 | Jacobson et al. |
| 2011/0006301 A1 | 1/2011 | Yamazaki et al. |
| 2011/0007042 A1 | 1/2011 | Miyaguchi |
| 2011/0086680 A1 | 4/2011 | Kim et al. |
| 2011/0132643 A1 | 6/2011 | Hattori et al. |
| 2011/0227064 A1 | 9/2011 | Park et al. |
| 2011/0227086 A1 | 9/2011 | French |
| 2011/0227846 A1 | 9/2011 | Imazeki |
| 2011/0250435 A1 | 10/2011 | Ge et al. |
| 2011/0261040 A1 | 10/2011 | Han et al. |
| 2011/0272181 A1 | 11/2011 | Koo et al. |
| 2012/0056173 A1 | 3/2012 | Pieralisi |
| 2012/0062447 A1 | 3/2012 | Tseng et al. |
| 2012/0127087 A1 | 5/2012 | Ma |
| 2012/0146886 A1 | 6/2012 | Minami et al. |
| 2012/0175607 A1 | 7/2012 | Shu et al. |
| 2012/0186859 A1 | 7/2012 | Yamashita |
| 2012/0218219 A1 | 8/2012 | Rappoport et al. |
| 2012/0242588 A1 | 9/2012 | Myers et al. |
| 2012/0243151 A1 | 9/2012 | Lynch |
| 2012/0248451 A1 | 10/2012 | Sone et al. |
| 2012/0307423 A1 | 12/2012 | Bohn et al. |
| 2013/0020731 A1 | 1/2013 | Kim et al. |
| 2013/0021289 A1 | 1/2013 | Chen et al. |
| 2013/0069061 A1 | 3/2013 | Nakazawa |
| 2013/0076601 A1 | 3/2013 | Wang et al. |
| 2013/0081756 A1 | 4/2013 | Franklin et al. |
| 2013/0082984 A1 | 4/2013 | Drzaic et al. |
| 2013/0088671 A1 | 4/2013 | Drzaic et al. |
| 2013/0135244 A1 | 5/2013 | Lynch et al. |
| 2013/0140965 A1 | 6/2013 | Franklin et al. |
| 2013/0148312 A1 | 6/2013 | Han et al. |
| 2013/0161622 A1 | 6/2013 | Lee |
| 2013/0333919 A1 | 12/2013 | Nguyen et al. |
| 2013/0342099 A1 | 12/2013 | Weber et al. |
| 2014/0000793 A1 | 1/2014 | Takahashi et al. |
| 2014/0042406 A1 | 2/2014 | Degner et al. |
| 2014/0042427 A1 | 2/2014 | Hung et al. |
| 2014/0049449 A1 | 2/2014 | Park et al. |
| 2014/0049500 A1 | 2/2014 | Chen et al. |
| 2014/0055429 A1 | 2/2014 | Kwon et al. |
| 2014/0055702 A1 | 2/2014 | Park et al. |
| 2014/0078692 A1 | 3/2014 | Park et al. |

(56) References Cited

U.S. PATENT DOCUMENTS

| | | |
|---|---|---|
| 2014/0092338 A1 | 4/2014 | Miyazaki et al. |
| 2014/0138637 A1 | 5/2014 | Yang et al. |
| 2014/0152646 A1 | 6/2014 | Kang et al. |
| 2014/0183473 A1 | 7/2014 | Lee et al. |
| 2014/0197531 A1 | 7/2014 | Bolognia |
| 2014/0217373 A1 | 8/2014 | Youn et al. |
| 2014/0217382 A1 | 8/2014 | Kwon et al. |
| 2014/0217397 A1 | 8/2014 | Kwak et al. |
| 2014/0231761 A1 | 8/2014 | Kim et al. |
| 2014/0232956 A1 | 8/2014 | Kwon et al. |
| 2014/0306941 A1 | 10/2014 | Kim et al. |
| 2014/0307396 A1 | 10/2014 | Lee |
| 2014/0354143 A1 | 12/2014 | Jung et al. |
| 2015/0137102 A1 | 5/2015 | Yang |
| 2015/0193041 A1 | 7/2015 | Shepelev |
| 2015/0382446 A1 | 12/2015 | Kwon et al. |
| 2016/0085125 A1 | 3/2016 | Park et al. |
| 2016/0093644 A1 | 3/2016 | Ki et al. |
| 2016/0155788 A1 | 6/2016 | Kwon et al. |
| 2017/0110529 A1* | 4/2017 | Zhang ................ H01L 27/3276 |

FOREIGN PATENT DOCUMENTS

| | | |
|---|---|---|
| EP | 2 341 759 A2 | 7/2011 |
| JP | 9-321083 A | 12/1997 |
| JP | 2000-163031 A | 6/2000 |
| JP | 2001-102595 A | 4/2001 |
| JP | 2002-342033 A | 11/2002 |
| JP | 2003-57661 A | 2/2003 |
| JP | 2004-119871 A | 4/2004 |
| JP | 2005-79472 A | 3/2005 |
| JP | 2005-303220 A | 10/2005 |
| JP | 2007-227875 A | 9/2007 |
| JP | 2009-48007 A | 3/2009 |
| JP | 2009-94099 A | 4/2009 |
| JP | 2010-60866 A | 3/2010 |
| JP | 2012-128006 A | 7/2012 |
| JP | 2012-238005 A | 12/2012 |
| KR | 10-2009-0093859 A | 9/2009 |
| KR | 10-0961268 B1 | 6/2010 |
| KR | 10-2011-0068169 A | 6/2011 |
| KR | 10-2014-0025931 A | 3/2014 |
| KR | 10-2014-0085956 A | 7/2014 |
| TW | 200705001 A | 2/2007 |
| TW | 200712705 A | 4/2007 |
| TW | 201230343 A1 | 7/2012 |
| WO | 96/04682 A1 | 2/1996 |
| WO | 01/69577 A2 | 9/2001 |
| WO | 2008/001051 A2 | 1/2008 |
| WO | 2011/049182 A1 | 4/2011 |
| WO | 2011/071198 A1 | 6/2011 |
| WO | 2011/151970 A1 | 12/2011 |
| WO | 2012/078040 A1 | 6/2012 |

OTHER PUBLICATIONS

International Search Report and Written Opinion, dated Dec. 17, 2015, for International Application No. PCT/KR2015/009299, 11 pages.

International Search Report and Written Opinion, dated Dec. 22, 2015, for International Application No. PCT/KR2015/009582, 9 pages.

International Search Report, dated Dec. 8, 2015, for International Application No. PCT/KR2015/009075, 4 pages.

International Search Report, dated Feb. 18, 2016, for International Application No. PCT/KR2015/011941, 4 pages.

International Search Report, dated Feb. 5, 2016, for International Application No. PCT/KR2015/011274, 4 pages.

Kim et al., "Stretchable Electronics: Materials Strategies and Devices," *Adv. Mater.* 20:4887-4892, 2008.

Kim et al., "Optimized Structural Designs for Stretchable Silicon Integrated Circuits," *Small* 5(24):2841-2847, 2009.

Lee et al., "A Multi-Touch Three Dimensional Touch Sensitive Tablet," *CHI '85 Proceedings of the SIGCHI Conference on Human Factors in Computing Systems,* San Francisco, California, USA, 1985, pp. 21-25.

Lu et al., "The effect of film thickness on the failure strain of polymer-supported metal films," *Acta Materialia* 58:1679-1687, 2010.

Lu et al., "Metal films on polymer substrates stretched beyond 50%," *Applied Physics Letters* 91:221909, 2007. (3 pages).

Office Action, dated Jan. 12, 2016, for U.S. Appl. No. 14/511,945, 7 pages.

Office Action, dated Jun. 15, 2016, for U.S. Appl. No. 14/511,945, 9 pages.

Office Action, dated Oct. 22, 2015, for U.S. Appl. No. 14/570,881, 7 pages.

Notice of Allowance, dated Feb. 25, 2016, for U.S. Appl. No. 14/570,881, 5 pages.

Notice of Allowance, dated Nov. 9, 2016, for U.S. Appl. No. 14/511,945, 5 pages.

Rubine, "The Automatic Recognition of Gestures," dissertation, Carnegie Mellon University, 1991. (285 pages).

Rubine, "Combining gestures and direct manipulation," *CHI '92 Proceedings of the SIGCHI Conference on Human Factors in Computing Systems,* Monterey, California, USA, May 3-7, 1992, pp. 659-660.

Vanfleteren et al., "Printed circuit board technology inspired stretchable circuits," *Mrs Bulletin* 37:254-260, 2012.

Verplancke et al., "Thin-film stretchable electronics technology based on meandering interconnections: fabrication and mechanical performance," *J. Micromech. Microeng.* 22:015002, 2012. (10 pages).

Westerman, "Hand tracking, finger identification, and chordic manipulation on a multi-touch surface," dissertation, University of Delaware, 1999. (363 pages).

* cited by examiner

FLEXIBLE DISPLAY DEVICE PROVIDING STRUCTURES TO MINIMIZE FAILURE GENERATED IN BENT PORTION

CROSS-REFERENCE TO RELATED APPLICATIONS

This application claims the priority of Korean Patent Application No. 10-2016-0178884 filed on Dec. 26, 2016, in the Korean Intellectual Property Office, the disclosure of which is incorporated herein by reference.

BACKGROUND

Technical Field

The present disclosure relates to a flexible display device.

Description of the Related Art

An image display device which implements various information on a screen is being developed to be thinner, lighter, more portable, and to have higher performance. Therefore, an organic light emitting display device which controls an amount of light emitted from an organic light emitting element to display an image is gaining popularity.

The organic light emitting element is a self-emitting element using a thin light emitting layer between electrodes so that it is advantageous to be manufactured to be thinner. A general organic light emitting display device has a structure in which a pixel driving circuit and the organic light emitting element are formed on the substrate and light emitted from the organic light emitting element passes through the substrate or a barrier layer to display an image.

The organic light emitting display device is implemented without having a separate light source device, which makes it possible to be implemented as a flexible display device. In this case, a flexible material such as plastic or metal foil is used as a substrate of the organic light emitting display device.

In this regard, studies have been carried out to with respect wrapping or bending various parts of a display device having flexible properties for the organic light emitting display device implemented as a flexible display device. New designs and user interface (UI)/user experience (UX) applications are being developed, and efforts to reduce a size of an edge or bezel of the display device are being made.

BRIEF SUMMARY

An aspect of the present disclosure is to suggest a bending structure of a flexible display device and a design of conductive lines or wires used therefor. Objects of the present disclosure are not limited to the above-mentioned objects, and other objects, which are not mentioned above, can be clearly understood by those skilled in the art from the following descriptions.

The present disclosure provides a flexible display device that includes: a base layer including a first portion in which an organic light emitting diode is disposed on a first surface and a second portion which has a bended section bent toward a second surface opposite to the first surface at the outside of the first portion; and conductive lines in the bended section, the conductive lines being disposed on two or more layers, and the conductive lines extend in a direction which is not parallel to a bending direction of the bended section.

Detailed matters of other embodiments are included in the detailed description and the drawings.

According to the embodiment of the present disclosure, a structure which minimizes failure generated in a bent portion of the flexible display device may be provided. More specifically, according to the embodiments of the present disclosure, a conductive line layout design which is tolerable to a bending stress and is efficiently disposed in a limited space may be provided. Therefore, a product reliability of the flexible display device according to the embodiment of the present disclosure may be improved. The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
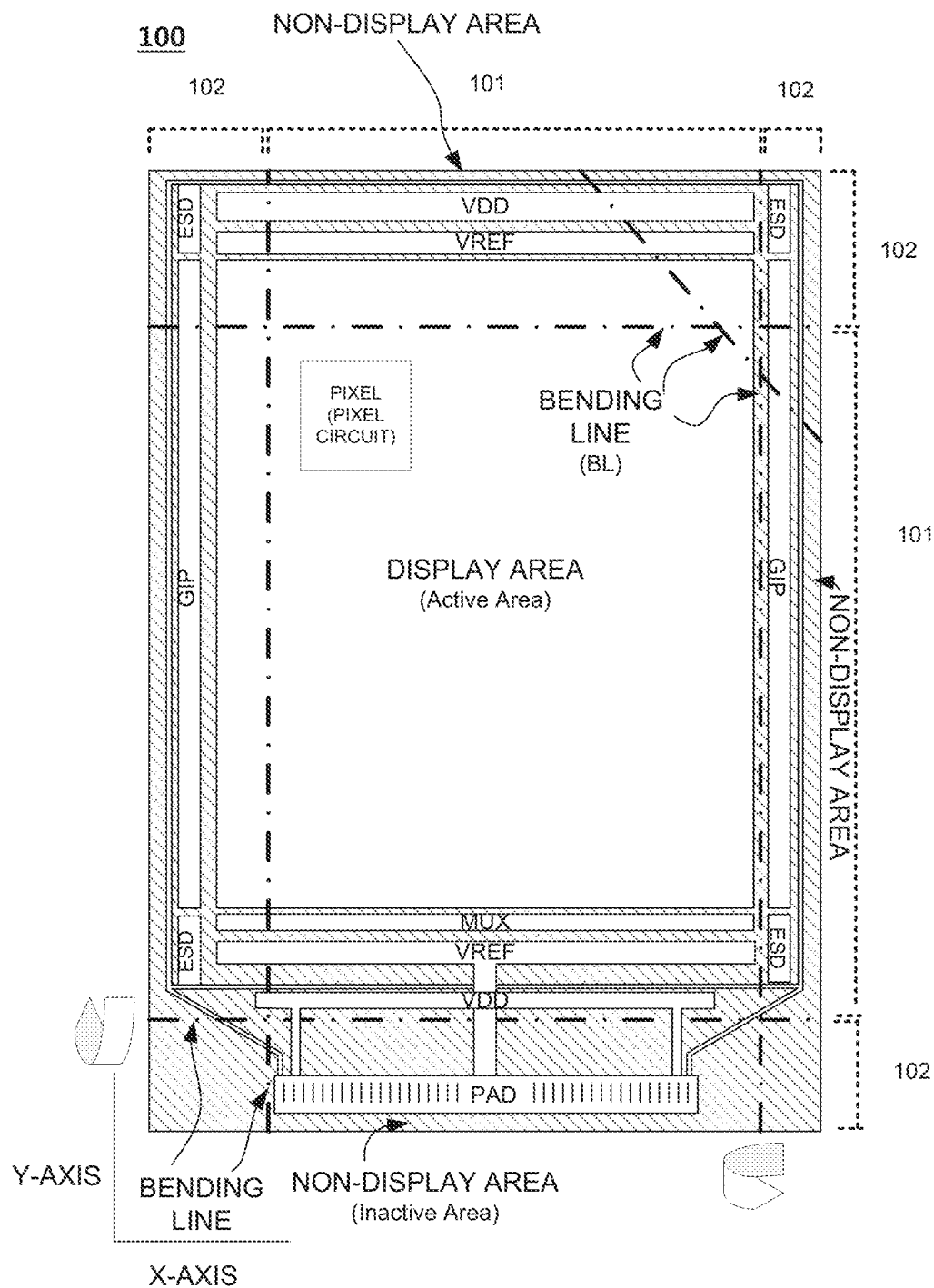
FIG. 1 illustrates a flexible display device which may be incorporated in electronic devices, according to an embodiment of the present disclosure.

The effects and characteristics of the present disclosure and a method of achieving the effects and characteristics will be clear by referring to the embodiments described below in detail together with the accompanying drawings. However, the present disclosure is not limited to the embodiments disclosed herein but may be implemented in various forms. The embodiments are provided by way of example only so that a person of ordinary skilled in the art can fully understand the features in the present disclosure and the scope thereof. Therefore, the present disclosure can be defined by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only." Any references to singular may include plural unless expressly stated otherwise. Components are interpreted to include an ordinary error range even if not expressly stated.

When the positional relationship between two parts is described using the terms such as "on," "above," "below," and "next," one or more parts may be positioned between the two parts unless the terms are used with the term "immediately" or "directly" is not used. When an element or layer is disposed "on" other element or layer, another layer or another element may be interposed directly on the other element or therebetween. If it is described that a component is "connected" or "coupled" to another component, it is understood that the component is directly connected or coupled to the other component but another component is "interposed" between each component, or each component may be "connected" or "coupled" via another components.

Although the terms "first," "second," and the like are used for describing various components, these components are not confined by these terms. These terms are merely used for distinguishing one component from the other components. Therefore, a first component may be a second component or vice versa according to the technical concepts of the present disclosure.

A size and a thickness of each component illustrated in the drawings are illustrated for convenience of description, and the present disclosure is not limited to the size and the thickness of the component illustrated. Hereinafter, various embodiments of the present disclosure will be described in detail with reference to accompanying drawings.

FIG. 1 illustrates a flexible display device which may be incorporated in electronic devices, according to an embodiment of the present disclosure.

The flexible display device refers to a display device provided with flexibility and may be used as the same meanings as a bendable display device, a rollable display device, an unbreakable display device, or a foldable display device. Referring to FIG. 1, the flexible display device 100 includes at least one display area (i.e., active area), in which an array of pixels is formed in the display area. One or more non-display areas (i.e., inactive areas) may be disposed at the periphery of the display area. That is, the non-display area may be adjacent to one or more sides of the display area. In FIG. 1, the non-display area encloses a quadrangular display area. However, a shape of the display area and a shape or layout of the non-display area adjacent to the display area are not limited to an example illustrated in FIG. 1. The display area and the non-display area may have a shape suitable for a design of an electronic apparatus mounted with the flexible display device 100. An exemplary shape of the display area is a pentagon, a hexagon, a circle, or an oval.

Each pixel, which includes a plurality of sub-pixels, in the display area may be associated with a pixel circuit. The pixel circuit may include one or more switching transistors and one or more driving transistors on the backplane. Each pixel circuit may be electrically connected to a gate line(s) and a data line(s) in order to send and receive signals with one or more driving circuits such as a gate driver and a data driver located in the non-display area.

The driving circuit may be implemented with a thin film transistor (TFT) in the non-display area as illustrated in FIG. 1. The driving circuit may be referred to as a gate-in-panel (GIP) due to its implementation in the panel itself. Further, some components such as a data driver integrated circuit (IC) are mounted on a separated printed circuit board and is coupled to the connecting interface (e.g., pads/bumps or a pins) disposed in the non-display area using a circuit film such as a flexible printed circuit board (FPCB), a chip-on-film (COF), or a tape-carrier-package (TCP). The non-display area may be bent back or away together with the connecting interface so that the printed circuit (for example, COF or FPCB) is positioned at the rear side of the flexible display device 100.

The flexible display device 100 may include various additional components for generating a variety of signals or otherwise driving the pixels in the display area. The additional component which drives pixels may include an inverter circuit, a multiplexer, or an electrostatic discharge circuit. The flexible display device 100 may further include additional components associated with functionalities other than for driving the pixels. For example, the flexible display device 100 may include additional components which provide a touch sensing functionality, a user authentication functionality (for example, finger print scanning), a multi-level pressure (or force) sensing functionality, or a tactile (or haptic) feedback functionality. The above-mentioned additional components may be located in the non-display area and/or an external circuit which is connected to the connecting interface.

Figure 4:
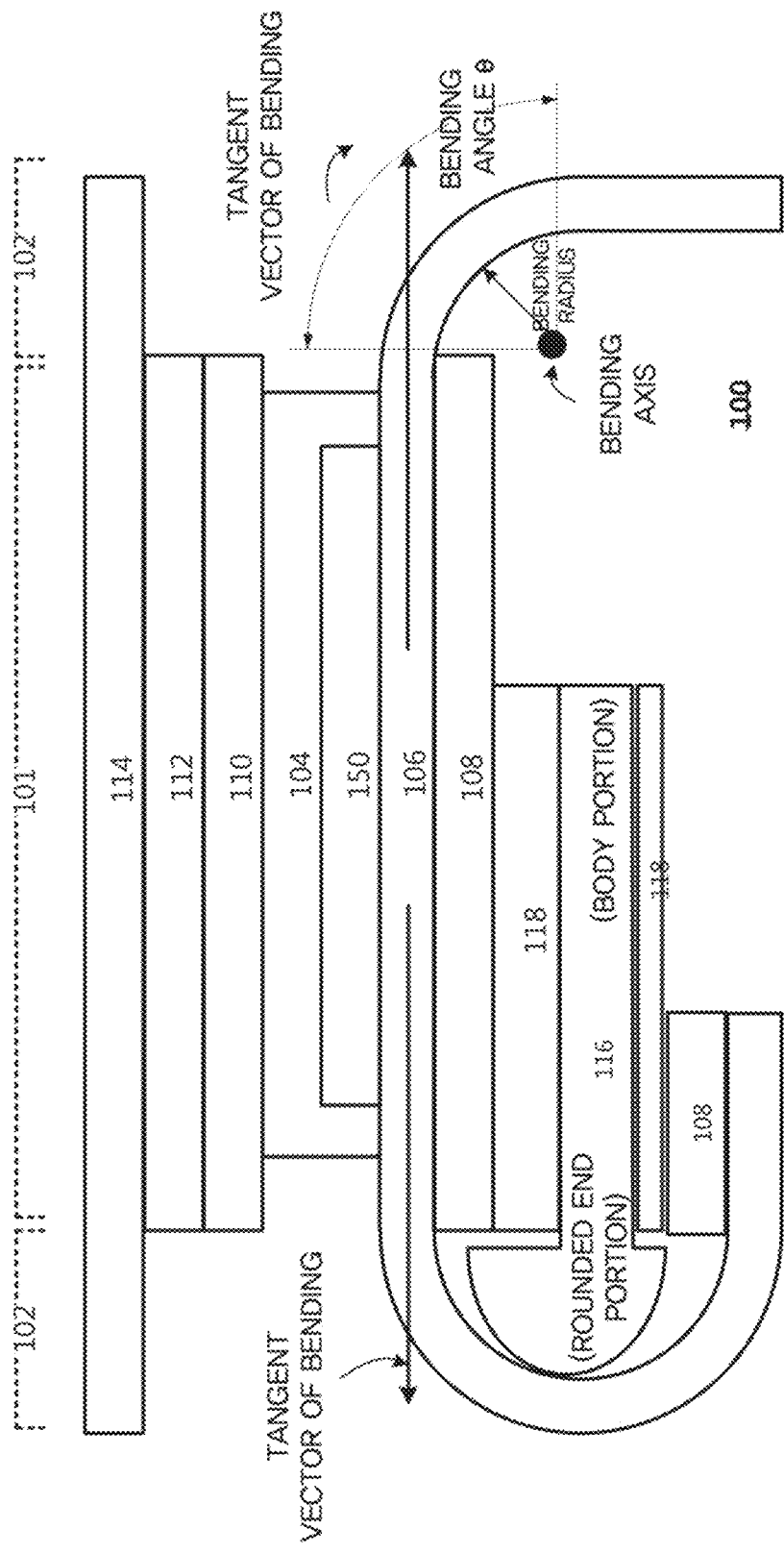
FIG. 4 is a cross-sectional view schematically illustrating a stack structure of a flexible display device according to an embodiment of the present disclosure.

Several parts of the flexible display device 100 can be bent along the (imaginary) bending line BL. The bending line BL may extend horizontally (e.g., X-axis illustrated in FIG. 1), vertically (e.g., Y-axis illustrated in FIG. 1) or even diagonally. Accordingly, the flexible display device 100 may be bent in any combination of horizontal, vertical and/or diagonal directions based on the desired design of the flexible display device 100. Associated with each bending line will be a bending axis, as shown in FIG. 4, as explained later herein.

One or more edges of the flexible display device 100 may be bent back or away from the plane of the central portion 101 along the bending line BL. Although the bending line BL is depicted as being located to be close to the edges of the flexible display device 100, the bending lines BL may extend across the central portion 101 or extend diagonally at one or more corners of the flexible display device 100. Such configurations would allow the flexible display device 100 to be provided as a foldable display device or a double-sided display device having display pixels on both outer sides of a folded display.

Since one or more parts of the flexible display device 100 are bendable, the flexible display device 100 may be substantially defined as a flat portion and a bent portion. One part of the flexible display device 100 may be referred to as a substantially flat central portion 101. Another part of the flexible display device 100 is bent at a predetermined angle and this part may be referred to as a bent portion 102. The bent portion 102 includes a bended section which is actually bent with a predetermined bending radius.

Figure 2:
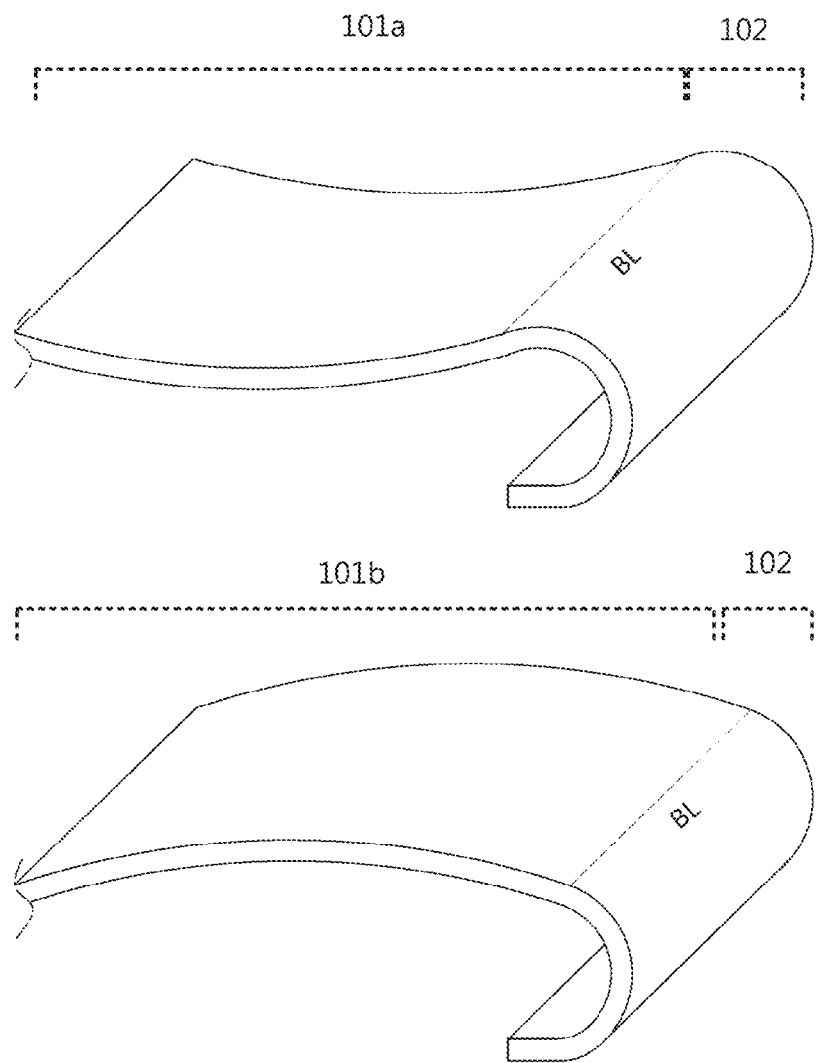
FIG. 2 illustrates a layout of a flat portion and a bent portion, according to an embodiment of the present disclosure.

A terminology of "substantially flat" includes a portion which is not completely flat. For example, a concave central portion 101a and a convex central portion 101b illustrated in FIG. 2 may be described as a substantially flat portion in some embodiments. In FIG. 2, one or more bent portions 102 are provided beside the concave central portion 101a and the convex central portion 101b and inwardly or outwardly bent with an angle with respect to a bending axis along the bending line BL. The bending radius of the bent portion 102 is smaller than the bending radius of the central portions 101a and 101b. In other words, the terminology of "substantially flat portion" refers to a portion having a curvature which is smaller than that of the adjacent section.

A portion at one side of the bending line in accordance with the position of the bending line BL is located toward the center of the flexible display device 100, but a portion at the other side of the bending line is located toward the edge of the flexible display device 100. The portion which is located toward the center of the flexible display device 100 may be mentioned as a central portion and the portion which is located toward the edge of the flexible display device 100 may be mentioned as an edge portion. The central portion of the flexible display device 100 may be substantially flat and the edge portion may be a bent portion. It should be mentioned that the substantially flat portion may be located also in the edge portion. Further, in some shapes of the flexible display device 100, the bended section may lie between two substantially flat portions.

As mentioned, when the non-display area is bent, the non-display area is not visible from the front surface of the display device or is minimally visible. A part of the non-display area which is visible from the front surface of the display device may be blocked by a bezel. The bezel may be formed by an independent structure or housing or other appropriate component. The part of the non-display area which is visible from the front surface of the display device may be hidden below an opaque mask layer made of black ink material (for example, a polymer which is filled with carbon black) or the like. The opaque mask layer may be provided on various layers (a touch sensor layer, a polarization layer, or a cover layer) included in the flexible display device 100.

In some embodiments, the bent portion of the flexible display device 100 may include a display area which displays an image. Hereinafter, the display area is referred to as a second display area. That is, the bending line BL may be located in the display area such that at least some pixels of the display area are included in the bent portion.

Figure 3A:
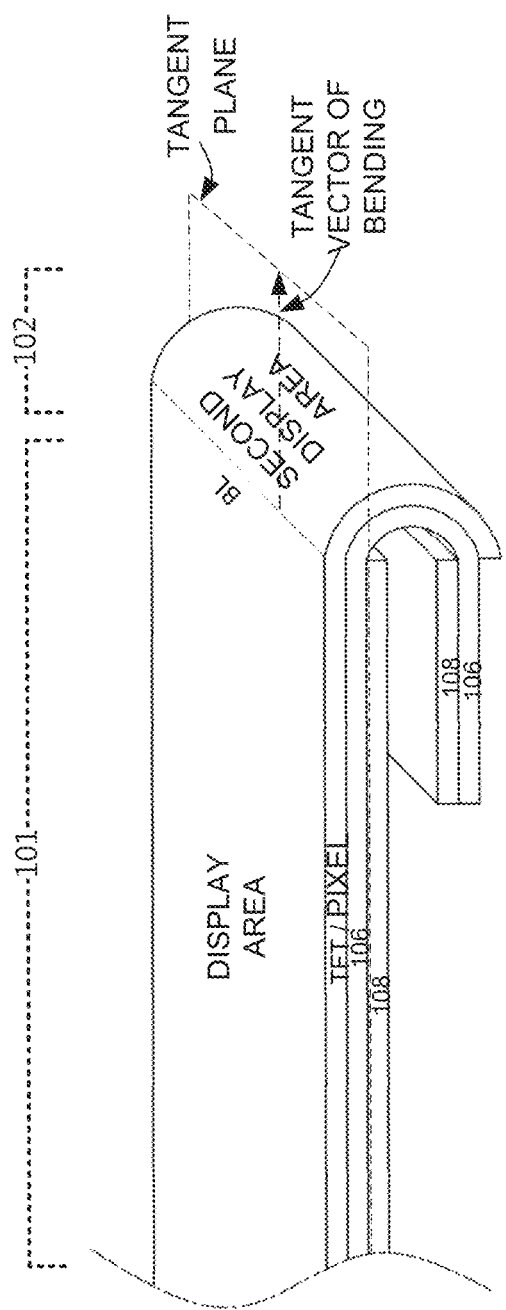
FIGS. 3A and 3B illustrate a layout of a display area of a flexible display device according to an embodiment of the present disclosure.
Figure 3B:
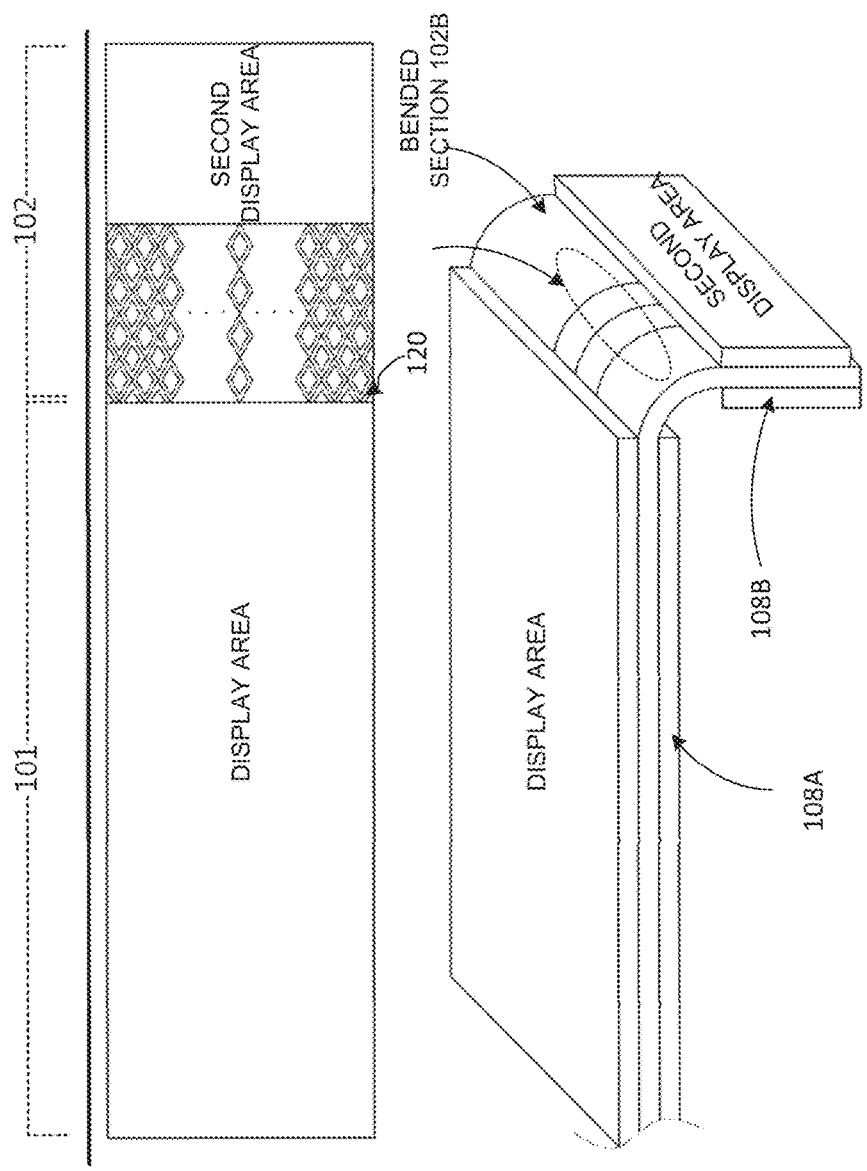

FIGS. 3A and 3B illustrate an arrangement of a display area of a flexible display device 100 according to an embodiment of the present disclosure, respectively.

In the shape of FIG. 3A, a pixel matrix in the second display area may continuously extend from the display area of the central portion 101. Alternatively, in the shape of FIG. 3B, the second display area in the bent portion 102 and the display area in the central portion 101 may be separated from each other with the bent section therebetween. Some components of the central portion 101 and the bent portion 102 may be electrically connected to each other through one or more conductive lines 120 which are located across the bent section.

The pixel of the second display area and the pixel in the central display area may be driven by a driving circuit (for example, a gate driver or a data driver) as if the pixels are located in the same matrix. In this case, the pixel of the second display area and the pixel of the central display area may operate by the same driving circuits. For example, an N-th row pixel of the central display area and an N-th row pixel of the second display area may be provided to receive a gate signal from the same gate driver. As illustrated in FIG. 3B, a part of the gate line which crosses the bent section or a bridge which connects the gate lines of two display areas may have a strain reducing shape.

Depending on a function of the second display area, the pixels of the second display area may be separated from the pixels of the central display area to be driven. That is, the pixels of the second display area may be recognized by the driving circuit as an independent pixel matrix which is separated from the pixel matrix of the display area. In this case, the pixels of the second display area may receive a signal(s) from one or more driving circuits which are separated from the driving circuit which supplies a signal(s) to the pixels of the central display area.

Regardless of the shape, the second display area of the bent portion may serve as a secondary display area of the flexible display device 100. Further, a size of the second display area is not specifically limited. The size of the second display area may depend on the function installed in an electronic device. For example, the second display area may be used to provide an image and/or a text such as a graphical user interface (GUI), an icon button, or a text message. In some cases, the second display area may be used to provide various color light for various purposes (for example, displaying the status). In this case, the size of the second display area does not need to be as large as the display area in the central portion.

FIG. 4 is a cross-sectional view schematically illustrating a stack structure of a flexible display device according to an embodiment of the present disclosure.

In FIG. 4, for the convenience of description, it is illustrated that the central portion 101 is substantially flat and the bent portion 102 is located at the edge of the flexible display device 100. As illustrated, one or more bent portions 102 have a bending angle θ and a bending radius R with respect to the bending axis and are outwardly bent from the central portion 101. The sizes of the bent portions 102 do not need to be the same. That is, lengths to the outer edge of a base layer 106 from the bending line BL in the respective bent portions 102 may be different from each other. Further, the bending angle θ of a circumference of the bending axis and the radius R of curvature from the bending axis may be different in each bent portion 102.

In the example illustrated in FIG. 4, a right side of the bent portion 102 has a bending angle θ and the bent portion 102 includes a section which is substantially planar. The bent portion 102 is bent at a larger bending angle θ so that a part of the bent portion 102 may be located below the central portion 101 like a left bent portion 102 of the flexible display device 100. Further, the bent portion 102 may be bent at a bending angle θ which is equal to or smaller than 90°.

In some embodiments, the radius of curvature of the bent portion 102 may be between about 0.1 mm and about 10 mm, more specifically, between about 0.1 mm and about 5 mm, more specifically between about 0.1 mm and about 1 mm, more specifically between about 0.1 mm and about 0.5 mm. In some embodiments, the radius of curvature of the bent portion 102 may be smaller than 0.5 mm. Such different ranges or parameters for the radius of curvature can accommodate flexible display devices of various size, shapes, and implementations.

In order to increase a rigidity and/or firmness at a specific portion of the flexible display device 100, one or more support layers 108 may be provided below the base layer 106. For example, the support layer 108 may be provided on a lower surface of the central portion 101. The support layer 108 may be absent in a bended section to allow for increased flexibility. The support layer 108 may be provided on the bent portion 102 which is located below the central portion 101. When a rigidity of a specific portion is increased, it helps to accurately configure and dispose various components in the flexible display device 100. When the base layer 106 has a larger elasticity than the support layer 108, the support layer 108 may contribute to reduce the crack (or damage) in the base layer 106.

The base layer 106 and the support layer 108 may be formed of a thin plastic film which can be configured by a combination of polyimide, polyethylene naphthalate (PEN) polyethylene terephthalate, and other appropriate polymers. Other appropriate materials used to form the base layer 106 and the support layer 108 may be thin glass, metal foil shielded by a dielectric substance, multilayer polymers, or a polymer film containing a polymer material combined with nanoparticles or microparticles. However, the support layer 108 which is provided in various portions of the flexible display device 100 does not need to be formed of the same material. For example, a thin glass layer is used for the support layer 108 in the central portion 101 and a plastic film may be used for the support layer 108 in the edge portion.

Thicknesses of the base layer 106 and the support layer 108 also need to be considered in the design of the flexible display device 100. According to an aspect, when the base layer 106 has an excessive thickness, it is difficult for the base layer 106 to be bent at a small radius of curvature. The excessive high thickness of the base layer 106 increases a mechanical stress on the components disposed thereon during bending. In contrast, if the base layer 106 is too thin, it may be too weak as a substrate to properly support the components disposed thereon.

In order to ease the bending of the substrate while providing sufficient support, a thickness of the base layer 106 is about 5 μm to about 50 μm. More specifically, the thickness of the base layer 106 may be in the range of about 5 μm to about 30 μm, and more specifically about 5 μm to about 16 μm. The thickness of the support layer 108 may have a thickness from about 100 μm to about 125 μm, from about 50 μm to about 150 μm, from about 75 μm to about 200 μm, less than 150 μm or more than 100 μm. Such different ranges or parameters for the base layer thickness can accommodate flexible display devices of various size, shapes, and implementations.

In one embodiment, a polyimide layer having a thickness between about 10 μm and about 16 μm is used as the base layer 106 and a polyethylene terephthalate (PET) layer having a thickness between about 50 μm and about 125 μm is used as the support layer 108. In another embodiment, a polyimide layer having a thickness between about 10 μam and about 16 μm is used as the base layer 106 and thin glass having a thickness between about 50 μm and about 200 μm is used as the support layer 108. In another embodiment, the thin glass is used as the base layer 106 and the base layer 106 has a polyimide layer which serves as the support layer 108 to reduce the damage.

During the manufacturing process, some parts of the flexible display device 100 may be undesirably exposed to the light. The material used to manufacture the components or the components may undergo unwanted status changes (for example, threshold voltage transition in a TFT) due to light exposure while manufacturing the flexible display device 100. Some parts of the flexible display device 100 are excessively exposed to the light as compared with other parts, which may cause display non-uniformity (for example, mura or shadow defects). In order to reduce the above-mentioned problem, the base layer 106 and/or the support layer 108 may include one or more materials which may reduce an amount of light or the affects thereof.

For example, a light shielding material such as chlorinated carbon black can be mixed into a constituent material (polyimide or other polymer) of the base layer 106. As described above, the base layer 106 may be formed from polyimide having a shade characteristic which provides a light blocking functionality. The base layer 106 reduces reflection of the light which is incident from the front surface of the flexible display device 100, to improve visibility.

Instead of the base layer 106, the support layer 108 itself may include a light blocking material to reduce the amount of light which is incident from a rear surface (that is, a surface on which the support layer 108 is attached) of the flexible display device 100. The constituent material of the support layer 108 may be mixed with one or more light blocking materials, similarly to those described above. Moreover, both the base layer 106 and the support layer 108 may include one or more light blocking materials. Here, there is no need to use the same light blocking material for the base layer 106 and the support layer 108.

When the base layer 106 and the support layer 108 block the unnecessary external light, the display uniformity is improved and reflection is reduced. However, in this case, it may be difficult to recognize an alignment mark that can be used as a reference to accurately dispose components during the manufacturing process. For example, since the arrangement of layers is determined by comparing outer peripheries of the overlapping part, it may be further difficult to accurately dispose the components on the base layer 106 or align the components during the bending of the flexible display device 100. In addition, when the base layer 106 and/or the support layer 108 blocks an optical spectrum in an excessive range (that is, wavelengths of visible light, ultraviolet light, and infrared spectrum), there may be a problem to identify debris or foreign matter in the flexible display device 100.

Therefore, in some embodiments, the light blocking material included in the base layer 106 and/or the support layer 108 is configured to pass specific polarization and/or light within a specific wavelength range used during one or more manufacturing/inspection process. For example, the support layer 108 may pass light (for example, UV or IR) used during a quality inspection and/or alignment process but block light in a wavelength range of visible light. When the base layer 106 includes the light blocking material, the wavelength in the limited range may help to reduce a non-uniformity problem of the display device which is caused by a shade generated by a printed circuit film attached on the base layer 106.

Both the base layer 106 and the support layer 108 may perform together to block or pass specific type of light. For example, the support layer 108 may change the polarization of light so that the light does not pass through the base layer 106. As described above, a specific type of light may pass through the support layer 108 for various purposes while manufacturing the flexible display device 100, but does not pass through the base layer 106 so as not to unnecessarily affect components disposed on an opposite surface of the base layer 106.

The backplane of the flexible display device 100 is implemented on the base layer 106. In some embodiments, the backplane of the flexible display device 100 is implemented together with a TFT which uses a low temperature poly silicon (LTPS) semiconductor layer as an active layer. In an example, pixel circuits and driving circuits (for example, a GIP) on the base layer 106 may be implemented by an NMOS LTPS TFT. In another example, the backplane of the flexible display device 100 may be implemented by a combination of an NMOS LTPS TFT and a PMOS LTPS TFT. For example, the driving circuit (for example, a GIP) on the base layer 106 may include one or more CMOS circuits to reduce the number of traces controlling a scan signal on a gate line.

Furthermore, in some embodiments, the flexible display device 100 may employ various types of TFTs to implement driving circuits in the pixel circuit in the non-display area and/or the display area. That is, in order to implement the backplane of the flexible display device 100, a combination of an oxide semiconductor TFT and the LTPS TFT may be used. In the backplane, a type of the TFT may be selected in accordance with an operating condition and/or a TFT requirement in the related circuit.

Since the LTPS TFT generally exhibits an excellent carrier mobility in a small profile, the LTPS TFT is suitable to be implemented an integrated driving circuit. The carrier mobility allows the LTPS TFT to be suitable for a component which has a high operating speed. In spite of the above-mentioned advantage, initial threshold voltages may be different between LTPS TFTs due to a grain boundary of a polycrystalline silicon semiconductor layer.

A TFT which employs an oxide based semiconductor layer such as an indium gallium zinc oxide (IGZO) semiconductor layer (hereinafter, referred to as an oxide TFT) is different from the LTPS TFT in many aspects. In spite of the low mobility as compared with the LTPS TFT, the oxide TFT is more advantageous in power efficiency than the LTPS TFT. In an off state, a low leakage current of the oxide TFT may maintain an active state longer. When a high frame rate is not necessary to drive the pixels, this may be advantageous in driving the pixels at a reduced frame rate.

For example, the flexible display device 100 may have a characteristic in that all or some pixels of the display area are driven at a reduced frame rate under a specific condition. In this situation, the pixel may be refreshed at a reduced rate depending on contents displayed on the flexible display device 100. Further, a partial display area which displays still image data (for example, a user interface or text) may be refreshed at a lower rate than other display area which displays image data (for example, a movie) which is quickly changed. In the pixel which is driven at a reduced refreshed rate, a blank period in which a data signal is not supplied to the pixel may be increased, which may minimize the consumed power by supplying the same image data to the pixels. In this embodiment, some TFTs which implement the pixel circuit and/or the driving circuit may be formed as an oxide TFT to minimize a leakage current during the blank period. The pixel may achieve a more stable brightness level even when the display is refreshed at a reduced rate by reducing the leakage current in the pixel circuit and/or the driving circuit.

Another characteristic of the oxide TFT is that the initial threshold voltage between transistors is not changed as much as the LTPS TFT. This characteristic may be advantageous when the size of the flexible display device 100 is increased. Further, movement of the threshold value is different between the LTPS TFTs and the oxide TFTs under a bias stress.

In consideration of the above-mentioned characteristics of the LTPS TFT and the oxide TFT, according to some embodiments of the flexible display device 100, the LTPS TFT and the oxide TFT are combined to be applied to one backplane. Specifically, some embodiments of the flexible display device 100 may employ the LTPS TFT to implement the driving circuit (for example, GIP) in the display area and apply the oxide TFT to implement the pixel circuit in the display area. Due to carrier mobility of the LTPS TFT, the driving circuit implemented by the LTPS TFT may operate at a higher speed as compared with the driving circuit implemented by the oxide TFTs. In addition, a more integrated driving circuit may be provided by the LTPS TFT and thus the size of the non-display area may be reduced. The leakage current may be reduced in the pixel by an improved voltage holding ratio of the oxide TFT which is used for the pixel circuit. Further, the pixel may be driven at a reduced frame rate in a specific portion of the display area or under a predetermined condition (for example, when a still image is displayed) while minimizing a display defect caused by the leakage current.

In some embodiments, the pixel circuit is implemented by the oxide TFT and the driving circuit is implemented by a combination of an N type LTPS TFT and a P type LTPS TFT. For example, the N type LTPS TFT and the P type LTPS TFT may be used to implement a CMOS gate driver (for example, a CMOS GIP or a data driver). In contrast, the oxide TFT may be applied to at least some portions of the pixel circuit. Differently from the GIP which is entirely formed of a P type or N type LTPS TFT, a gate output signal from the CMOS gate driver may be controlled by a DC signal or a logic high/low signal. By doing this, the gate line is more stably controlled during the blank period to suppress current leakage from the pixel circuit and activation of unintended pixels.

The CMOS gate driver or an inverter circuit on the backplane may be implemented by a combination of the LTPS TFT and the oxide TFT. For example, the P type LTPS TFT and the N type oxide TFT may be used to implement the CMOS circuit. Further, the pixel circuit of the display area may be implemented using both the LTPS TFT and the oxide TFT. When two types of TFTs are applied to the pixel circuit and/or the driving circuit, the LTPS TFT may be tactically located in the circuit in order to remove bias remaining in a node between the oxide TFTs and minimize the bias stress (for example, PBTS and NBTS) during the off state. Additionally, a TFT which is connected to a storage capacitor in the circuit may be formed as an oxide TFT to reduce the leakage current.

An organic light emitting diode (OLED) layer is disposed on the base layer 106. The organic light emitting diode layer 150 includes a plurality of OLED elements. The OLED element is controlled by a pixel circuit and a driving circuit implemented on the base layer 106 and other external driving circuit which is connected to a connecting interface on the base layer 106. The OLED layer includes an organic light emitting material layer which emits light with specific color (for example, red, green, and blue). In some embodiment, the organic light emitting material layer may have a stack-up structure which may emit white light (essentially, a combination of various color light).

An encapsulation layer 104 is provided to protect the organic light emitting diode layer 150 from air and moisture. The encapsulation layer 104 may include various material layers to reduce penetration of air and moisture. In some embodiments, the encapsulation layer 104 may be provided as one or more thin films.

The flexible display device 100 may include a polarization layer 110 to control a display characteristic (for example, external light reflection, color accuracy, and luminance). Further, the cover layer 114 may be used to protect the flexible display device 100.

An electrode for sensing touch inputs of a user may be formed on one surface of the cover layer 114 and/or in at least one surface of the polarization layer 110. If necessary, an independent layer (hereinafter, referred to as a touch sensor layer 112) equipped with a touch sensing electrode and/or other component related to touch input sensing may be provided in the flexible display device 100. The touch sensing electrode (for example, a touch driving/sensing electrode) may be formed of a transparent conductive material such as indium tin oxide, a carbon based material including graphene, a carbon nanotubes, conductive polymer, or a hybrid material made of a mixture of various conductive/non-conductive materials. Further, a metal mesh, for example, aluminum mesh or silver mesh may be used for the touch sensing electrode.

The touch sensor layer 112 may include one or more modified dielectric materials. One or more electrodes may be interfaced with the touch sensor layer 112 or located in the vicinity of the touch sensor layer 112 or read a signal for measuring an electric change on the electrode. The measuring is analyzed so that an amount of a pressure input to the flexible display device 110 is evaluated at several levels.

In some embodiments, the touch sensing electrode is utilized to identify a position of a user input and evaluate a pressure of the user input. The touch input position identification and the touch pressure measurement may be performed by measuring a change in a capacitance of the touch sensing electrode on one surface of the touch sensor layer 112. The touch sensing electrode and/or other electrode may be used to measure a signal indicating an amount of pressure on the flexible display device 100 by the touch input. The signal is obtained from the touch sensing electrode at the same timing or at a different timing with the touch signal.

The modified material included in the touch sensor layer 112 may be an electro-active material and an amplitude and/or a frequency of the material is controlled by an electric signal and/or an electric field. The modified material includes piezo-ceramic and electro-active polymer. Therefore, the touch sensing electrode and/or a separate electrode activates the modified material to bend the flexible display device 100 in a desired direction. Additionally, the electro-active material is activated to vibrate at a desired frequency to provide a tactile and/or texture feedback on the flexible display device 100. The flexible display device 100 employs a plurality of electro-active materials to provide the bending or vibration of the flexible display device 100 at the same timing or at a different timing.

Some components may make bending or folding of the flexible display device 100 along the bending line BL difficult. Some components such as the support layer 108, the touch sensor layer 112, and the polarization layer 110 may add strength to the flexible display device 100. Further, the thickness of the components move a neutral plane of the flexible display device 100 and some of the components create a bending stress larger than the other components.

For the purpose of easier bending/folding and reliability improvement of the flexible display device 100, configuration of the components in the bent portion 102 is different from that in the central portion 101. Some components provided in the central portion 101 are not disposed in the bent portion 102 or provided with a different thickness. The support layer 108, the polarization layer 110, the touch sensor layer 112, a color filter layer and/or other components which hinder the bending of the flexible display device 100 may not be provided in the bent portion 102. When the bent portion 102 is not visible or accessible to the user, the above-mentioned components are unnecessary.

In order to provide information to the user, the second display area can be provided in the bent portion 102. However, some of the above-mentioned components are unnecessary depending on the purpose and/or the form of the information provided by the second display area. For example, when the second display area displays text or a simple GUI by simply emitting color light or simple light and darkness combinations (for example, a black colored text or icon on a white background), the polarization layer 110 and/or the color filter layer are unnecessary for the bent portion 102. Further, when the touch function is unnecessary for the bent portion 102, the touch sensor layer 112 may not be provided. Even though an auxiliary display area for displaying information is not provided in the bent portion 102, if necessary, the bent portion 102 may include the touch sensor layer 112 and/or the electro-active material layer.

Since the bended section is most affected by the bending stress, various stress reducing structures are applied to the component on the bended section. To this end, some of the components in the central portion 101 are not provided in at least a part on the bent portion 102. The components are selectively removed from the bended section so that components in the central portion 101 and the bent portion 102 are separated. Therefore, the bended section is free from certain components that are prone to bending stress.

As illustrated in FIG. 4, since the support layer 108 is not provided in the bended section 102b, the support layer 108 in the central portion 101 and the support layer 108 in the bent portion 102 may be spaced apart from each other. Instead of the support layer 108 attached onto the base layer 106, a supporting member 116 with a rounded end portion may be disposed in the bended section below the base layer 106. Various other components, for example, the polarization layer 110 and the touch sensor layer 112 may not be provided in the bended section. The components may be removed by cutting, etching (wet etching or dry etching), scribing, and other appropriate method. Instead of the cutting or other removing method, a divided piece of the component is formed in the selected portion (for example, the central portion and the bent portion) so that the component may not be formed in the bended section. Instead of being completely removed from the bent portion 102, some components may have a bending pattern along the bending line and/or one part in the bended section to reduce the bending stress.

As mentioned above, the support layer 108 is not provided in the bended section for the purpose of each bending of the base layer 106. However, due to the absence of the support layer 108, the curvature of the bended section is easily deformed by external force. In order to support the base layer 106 and maintain the curvature of the bended section, the flexible display device 100 includes a supporting member 116. The supporting member may be referred to as a mandrel. The supporting member 116 illustrated in FIG. 2 includes a body portion and an end portion. The base layer 106 and the supporting member 116 are disposed such that the rounded end portion is located on the lower surface of the base layer 106 corresponding to the bended section.

In an embodiment in which the bent portion 102 is provided at the edge of the flexible display device 100, the supporting member 116 may be located at the edge of the flexible display device 100. In the above-described setting, as illustrated in FIG. 2, a part of the base layer 106 is located on the lower surface of the supporting member 116 while enclosing the end portion of the supporting member 116. Various circuits and components (a driving IC, a connecting interface with a connecting component, such as a chip on film (COF), and a printed circuit board) provided in the non-display area may be provided on the base layer 106 located at the back of the flexible display device 100. According to this manner, even though a component is not a flexible component, the component may be located below the display area.

The supporting member 116 may be formed of a plastic material such as polycarbonate (PC), polyimide (PI), polyethylene naphthalate (PEN), and polyethylene terephthalate (PET). A strength of the supporting member 116 formed of the plastic material may be controlled by additives which increases a thickness and/or a strength of the supporting member 116. The supporting member 116 may be formed with a desired color (for example, black or white). Further, the supporting member 116 may be formed of a solid material such as glass, ceramic, or metal or a combination thereof.

The size and shape of the end portion of the supporting member 116 may vary depending on a minimum curvature desired for the bended section. In some embodiments, the thicknesses of the end portion and the body portion may be substantially the same. In another embodiment, the planar body portion may be thinner than the end portion. The supporting member 116 may support the bended section 102b while avoiding further increasing the thickness of the flexible display device 100, by a thinner body portion.

Since the bended section is supported by the end portion of the supporting member 116, the body portion extending toward the central portion 101 of the flexible display device 100 does not need to extend to the display area. When the body portion extends below the display area for various reasons, a length of the body portion extending from the end portion to the opposite end is sufficient to reach the surface area which supports the supporting member 116.

In order to safely provide the supporting member 116 in the flexible display device 100, an adhesive layer 118 may be provided on a surface of the supporting member 116. The adhesive layer 118 may include a pressure sensitive adhesive, a foam type adhesive, a liquid adhesive, a light cured adhesive, or other appropriate adhesive material. In some embodiments, the adhesive layer 118 may be formed of a compressible material or include the compressible material to serve as a cushioning material for a portion adhered by the adhesive layer 118. For example, a constituent material of the adhesive layer 118 is compressible. The adhesive layer 118 may have a multilayered structure and the multilayered structure includes a cushioning layer (for example, polyolefin foam) disposed between upper and lower layers of the adhesive material layer.

The adhesive layer 118 may be located on one or more of upper and lower surfaces of the body portion of the supporting member 116. When the bent portion 102 of the flexible display device 100 encloses the end portion of the supporting member, the adhesive layer 118 may be provided on both the lower surface (that is, a surface facing the rear surface) and the upper surface (that is, a surface facing the front surface) of the body portion. If necessary, the adhesive layer 118 may be provided between the end portion of the supporting member 116 and an inner surface of the base layer 106.

During bending, a part of the flexible display device 100 on one surface of the supporting member 116 may be pulled toward the supporting member 116 and the base layer 106 may be impacted by uppermost and lowermost edges of the end portion. Therefore, the height of the adhesive layer 118 and the height of the support layer 108 between the supporting member 116 and the base layer 106 is equal to or larger than a vertical distance between the uppermost edge of the end portion and a surface of the body portion in which the adhesive layer 118 is located. In other words, a height of a space created due to the difference of the thicknesses of the end portion and the body portion is equal to or smaller than the added thicknesses of the supporting layer 108 and the adhesive layer 118.

The thickness of the adhesive layer 118 on the upper and lower surfaces of the body portion may vary depending on the type of the supporting member 116. For example, the body portion which is thinner than the end portion may not be provided at the center of the end portion. In this case, the space on one side of the supporting member 116 may be larger than a space on the opposite side.

In another example, a lowest edge of the end portion is located inside of a bottom line of the body portion so that a space is created only on one side of the body portion. In this case, the adhesive layer 118 on one side of the body portion may be thicker than that on the opposite side.

A plurality of conductive lines is included in the flexible display device 100 to electrically connect various components. Circuits located in the display area and the non-display area transmit various signals through one or more conductive lines to provide various functions. Some conductive lines may be used to interconnect the circuit and/or other components in the central portion and the bent portion.

The conductive line refers to a conductive path via which an electric signal, power and/or voltage can be transferred from one point to another point in the flexible display device 100. The conductive line may include a gate line/data line, a source/drain electrode of a TFT which transmits a signal from a display driving circuit (for example, a gate driver and a data driver) of the non-display area to a pixel circuit in the display area. Similarly, conductive lines such as a touch sensing electrode, a pressure sensing electrode, or a fingerprint sensing electrode may provide a signal for sensing touch input or recognizing a fingerprint on the flexible display device 100. Further, the conductive lines may provide interconnections between components of the display area of the central portion and components of the second display area of the bent portion.

A trace design of the conductive line is an important factor which may affect electrical/mechanical properties of the conductive line. In order to satisfy the electrical/mechanical requirements, a part of the conductive line may be configured to be different from other parts thereof. A structure for accommodating the bending stress is provided in one part of the conductive line provided in the bended section or in the vicinity of the bended section of the flexible display device 100.

Adjustment or relaxing of the bending stress of the insulating layer in the vicinity of the conductive line is as important as the adjustment of the strain of the conductive line. Various insulating layers such as the buffer layer, the protective layer, a gate insulating layer GI, and an interlayer insulating layer ILD provided on and/or below the conductive line 120 may include inorganic materials. A layer formed of an inorganic material, for example, a silicon oxide layer or a silicon nitride layer is generally more prone to crack than a metal layer of the conductive line. Even when the conductive line has a sufficient flexibility to withstand the bending stress without cracks, some of the cracks initiated from the insulating layer can propagate into the conductive line to cause poor electrical connection.

As a trace design which reduces the bending stress of the conductive line, some insulating layers on and/or below the conductive line 120 may be patterned to reduce the cracks. Various insulating layer patterning techniques such as wet etching and/or dry etching may be used to create a shape of the insulating layer corresponding to the wire trace. When an insulating layer, specifically, an inorganic material based insulating layer in the vicinity of the conductive line is omitted, chances of cracking are reduced and a propagation path is removed. For the convenience of description, a layout configuration of the conductive line 120 and the insulating layers which cover at least a part of the conductive line 120 is referred to as a "wire trace."

As mentioned above, a design for a conductive line and an insulating layer which covers the conductive line plays an important role to increase durability of the wire trace. Various factors from a thickness and a width to an unfolding angle of a trace piece with respect to the bending direction are associated with the design of the wire trace. In addition, many other factors related to the arrangement of the conductive line 120 and an insulating layer are specifically tuned based on the installation and direction of the trace.

The more the distance in which the wiring structure is extended is adjusted to the tangent vector of the curvature, the greater the deformation of the trace due to bending stress. In other words, when a length of the trace piece parallel to the tangent vector of the curvature is reduced, the wire trace may withstand the bending stress more. Regardless of the extending direction of the wire trace, there is always a portion which is measured in the bending direction in the wire trace. The bending direction will always be orthogonal to the bending axis, therefore as the display is bent, the bending direction may vary, depending on the location of the axis and the radius of curvature of the axis. However, by applying the strain reducing design to the wire trace, a length of a portion (that is, a piece) which is aligned to be parallel to the bending direction and continuously measured may be reduced.

Figure 5:
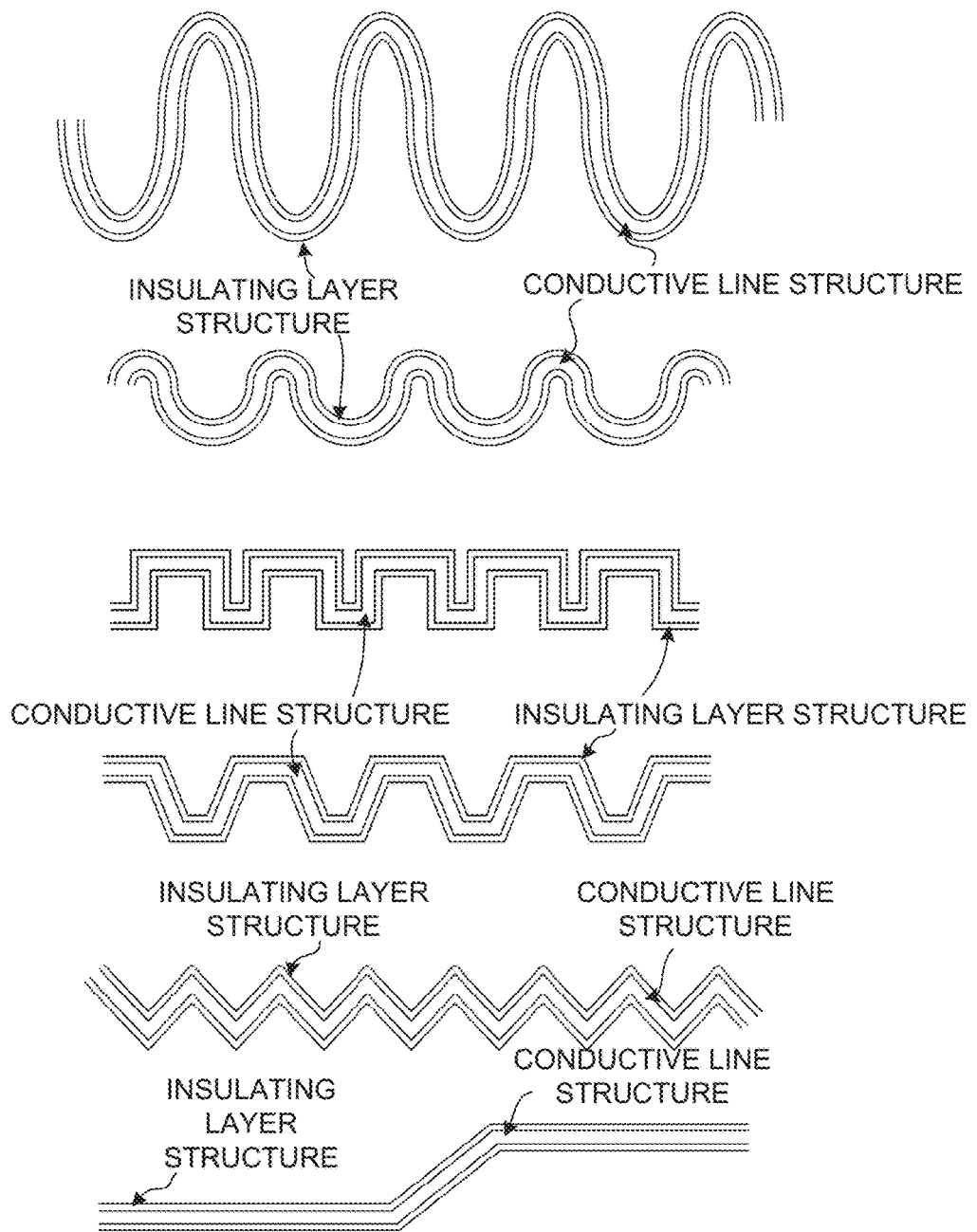
FIG. 5 illustrates some embodiments of strain reducing designs.

FIG. 5 illustrates some examples of strain reducing trace designs.

One or more designs of a sine-wave, a square-wave, a sawtooth, a wave, and a shaded shapes illustrated in FIG. 5 may be used for the wire trace. When the strain reducing design is applied, a trace portion which is aligned in a direction oblique to the tangent vector of the curvature is increased, which may limit the length of the trace piece linearly extending to be parallel to the bending direction.

Since the crack in the wire trace caused by bending the flexible display device generally starts from an inorganic insulating layer, it is also important to minimize a length of the insulating layer which is parallel to the tangent vector of the curvature. In the strain reducing design of one line, not only a width of the patterned inorganic insulating layer which meets the surface of the conductive line, but also the width and the shape of the conductive line need to be maintained to a minimum.

The strain reducing layout design illustrated in FIG. 5 is merely illustrative. Other layout designs which reduce a trace piece parallel to the bending direction may be used in various embodiments of the flexible display device 100. Further, some wire traces may employ a strain reducing layout design which is different from that of other wire trace in the flexible display device 100 in accordance with electrical and/or mechanical requirements. For example, a strain reducing layout design used for a data signal line may be different from a strain reducing layout design of a power line.

In order to further improve the durability, the wire trace may use an layout design which is repeatedly divided and gathered at a specific interval. In other words, the wire trace includes at least two sub traces to form a trace similar to a chain in which connection links are connected. Divided and gathered angles define a shape of each link and the shape of each link limits the length of the trace piece which can be measured at a straight line parallel to the bending direction.

Figure 6:
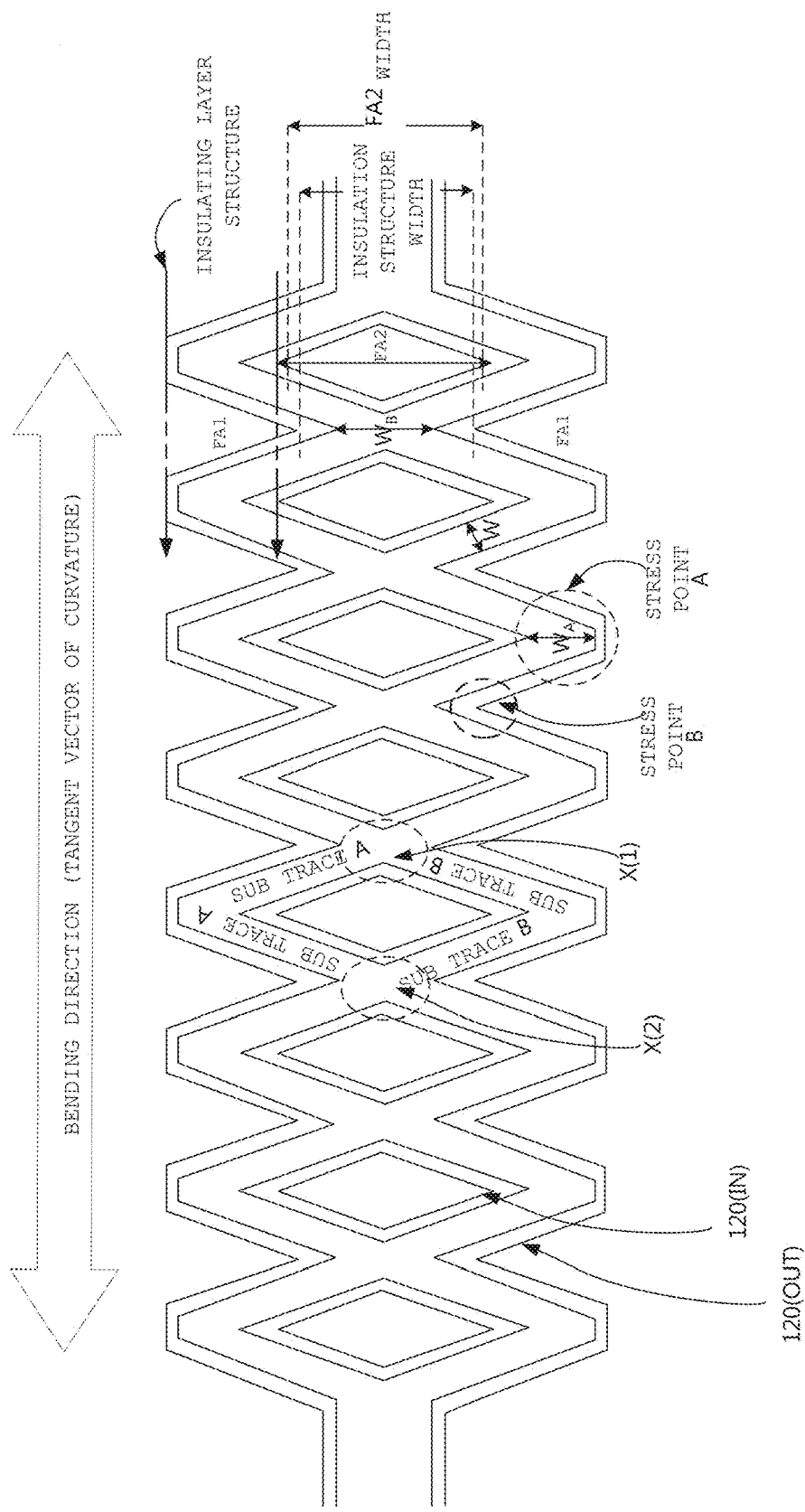
FIG. 6 illustrates a schematic view of a wire trace having a plurality of sub traces, according to an embodiment of the present disclosure.

Referring to FIG. 6, the conductive line 120 includes a sub trace A and a sub trace B which are divided and gathered at each joint X. A part of the sub trace A extends by a predetermined distance in the first direction at an angle away from the tangent vector of the curvature and another part of the sub trace A extends to a second direction between the first joint X1 and a second joint X2. The sub trace B is folded to the opposite direction with respect to the tangent vector of the curvature similarly to the sub trace A. The distance and the direction where the sub traces are disposed between two adjacent joints defines not only an open area enclosed by the sub traces but also a shape and a size of the link of the chain. In this example, the shape of the conductive line 120 between the first joint X1 and the second joint X2, that is, between links is a diamond shape which is enclosed by the sub trace A and the sub trace B and has an open area. The conductive line 120 forms a chain with a diamond shaped link together with an additional joint X and the trace may be referred to as a diamond trace. There are portions of conductive line 120 that extend in directions that are not along or parallel to the tangent vector at that particular point of the bending portion. The bending direction can be understood to mean the direction of the tangent vector at any particular point in the curvature of the bending substrate. The line 120 therefore has many different portions that extend in a direction that is not parallel to the bending direction.

As compared with the strain reducing trace design which is not divided as illustrated in FIG. 5, the strain reducing trace design illustrated in FIG. 6 may provide an important advantage to the electrical property. For example, the wire trace with a divided/gathered trace design has an electrical resistance which is much lower than the wire trace to which a strain reducing design of a mountain trace, a sine wave trace, or other single conductive line type is applied. In addition, when one trace is damaged, the sub trace may function as a preliminary path.

The insulating layer which covers a surface of the conductive line 120 is patterned by a layout design corresponding to the wire trace of the conductive line 120. In this case, the open area enclosed by the sub trace A and the sub trace B may not include an inorganic insulating layer or include an inorganic insulating layer which is thinner than an area below and/or above the structure of the conductive line 120. In this case, the length of the insulating layer which may be measured at a straight line parallel to the bending direction may be limited to reduce the cracking and propagation.

Various additional factors for the strain reducing design based on the plurality of sub traces need to be considered. The dividing and gathering angles, and the length of the sub traces between two adjacent joints X need to provide an offset for the inorganic insulating layer at an outer corner at which the joint X and the sub traces change a direction between two adjacent joints X. In other words, the open area enclosed by the sub traces between two joints X needs to have a size and a shape which minimize a length of the inorganic insulating layer structure of the trace extending to be parallel to the bending direction.

In the diamond trace design illustrated in FIG. 6, the buffer layer and the protective layer which cover the conductive line 120 are patterned with a predetermined margin from an outer structure (that is, an outer edge) of the conductive line 120. There is no insulating layer in the open area FA2 surrounded by the sub traces A and B other than the remaining insulating layer which covers the conductive line 120 with a predetermined margin. As described above, the layout structure of the insulating layer is formed correspondingly to the layout design of the conductive line 120. The length of the open area having no insulating layer which is measured in a direction perpendicular to the bending direction is larger than a width of the structure of the inorganic insulating layer at the joint X measured in the same direction. In this setting, not only the area beside the joint X but also the open area FA2 enclosed by the sub traces A and B may not have an inorganic insulating layer or may have a reduced number of inorganic insulating layers.

Referring to FIG. 6, the area FA1 which does not have an insulating layer suppresses the insulating layer of the sub trace A and the sub trace B between the two joints X1 and X2 from extending as a continuous straight line. Similarly, the area FA2 which does not have an insulating layer suppresses the insulating layer between the two joints X1 and X2 from extending as a continuous straight line. Accordingly, the length of the insulating layer arrangement piece aligned to the tangent vector of the curvature is minimized. The length of the insulating layer arrangement piece aligned to the tangent vector of the curvature may be further reduced by reducing a margin of the insulating layer over the width of the conductive line 120 and the edge of the conductive line 120.

The larger dividing/gathering angle with respect to the bending direction of the sub traces significantly reduces the lengths of the conductive line 120 extending along the tangent vector of the curvature and the insulating layer structure. Therefore, the dividing/gathering angle of the sub traces in an area with a high bending stress is selectively increased, so that a possibility of cracking in the wire trace is further lowered.

The dividing angle of the sub trace may affect the distance between two adjacent joints X in the diamond trace design. The distance between the joints X does not need to be uniform over the entire trace. The dividing and gathering interval of the trace may vary in one trace based on a degree of bending stress which is applied to a specific portion of the wire trace. The distance between the joints X may be gradually reduced in the specific portion of the trace directed to an area (for example, an area having a smaller bending radius or an area having a larger bending angle) to which a larger bending stress is applied. In contrast, when the specific portion of the trace directed to an area to which a smaller bending stress is applied, the distance between the joints X may be gradually increased.

Even though the strain reducing trace design is provided, an inevitable bending stress remains at one point (that is, a stress point) of the trace. A position of the stress point largely depends on the bending direction and the shape of the trace. Therefore, the wire trace may be designed such that the remaining bending stress is concentrated to a desired portion in a predetermined bending direction. When the stress point in the trace is known, a cracking stop area may be provided at the stress point so that the wire trace withstands the bending stress longer.

Referring to FIG. 6 again, when the wire trace having a diamond trace design is bent in a bending direction, the bending stress tends to be concentrated at angular corners (that is, vertices of diamond shaped link). The angular corners are represented by a stress point A and a stress point B. As described above, the crack starts between an inside and an outside of the wire trace and easily expands. For example, the crack may start from an inner trace 120(IN) and proceed to an outer trace 120(OUT) at the stress point A. Similarly, the crack may start from an outer trace 120 (OUT) and proceed to an inner trace 120(IN) at the stress point B.

Accordingly, the width of the conductive line 120 may be selectively increased to serve as a cracking stop area, at the stress point A. As described with reference to FIG. 6, the widths WA and WB of the conductive line 120 at the stress points A and B which are measured perpendicularly to the bending direction may be larger than the width W of the conductive line 120 between the stress points A and B. The added width at the stress point may allow the conductive line 120 to last longer until the crack at the stress point is increased and thus completely broken.

A length of a continuous portion of the insulating layer structure aligned to the bending direction needs to be maintained to a minimum. When the width of the conductive line 120 is increased at the stress points A and B, the width of the insulating layer structure is inevitably increased, which makes the insulating layer aligned to be parallel to the bending direction longer.

Therefore, in some embodiments, the width of the conductive line 120 which is measured in a vertical direction to the tangent vector of the curvature at the stress point A may be between about 2.5 µm and about 8 µm, more specifically, between about 3.5 µm and about 6 µm, more specifically between about 4.5 µm and about 8.5 µm, and more specifically between about 4.0 µm. The width of the conductive line 120 at the stress point B needs to be maintained to be similar to the width of the conductive line 120 at the stress point A. As described above, the width of the conductive line 120 at the stress point B may be between about 2.5 µm and about 8 µm, more specifically, between about 3.5 µm and about 6 µm, more specifically between about 4.5 µm and about 8.5 µm, and more specifically between about 4.0 µm. Since the sub trace A and the sub trace B are gathered at the stress point B, the width of the conductive line 120 at the stress point B may be longer than the width of the conductive line 120 at the stress point A.

In some embodiments, one of the inner trace 120(IN) and the outer trace 120(OUT) may not be sharply folded as other trace at the stress point A to minimize the occurrence of the crack on both sides. In the embodiment described with reference to FIG. 6, the inner trace 120(IN) is more sharply folded than the outer trace 120(OUT) at the stress point A. However, in another embodiment, the outer trace 120(OUT) may be more sharply folded than the inner trace 120(IN) at the stress point A. As illustrated in FIG. 6, in two cases, the less sharply folded trace may be more rounded than the straight line like the outer trace 120(OUT). Further, both the inner trace 120(IN) and the outer trace 120(OUT) at the stress point A may be rounded.

Figure 7A:
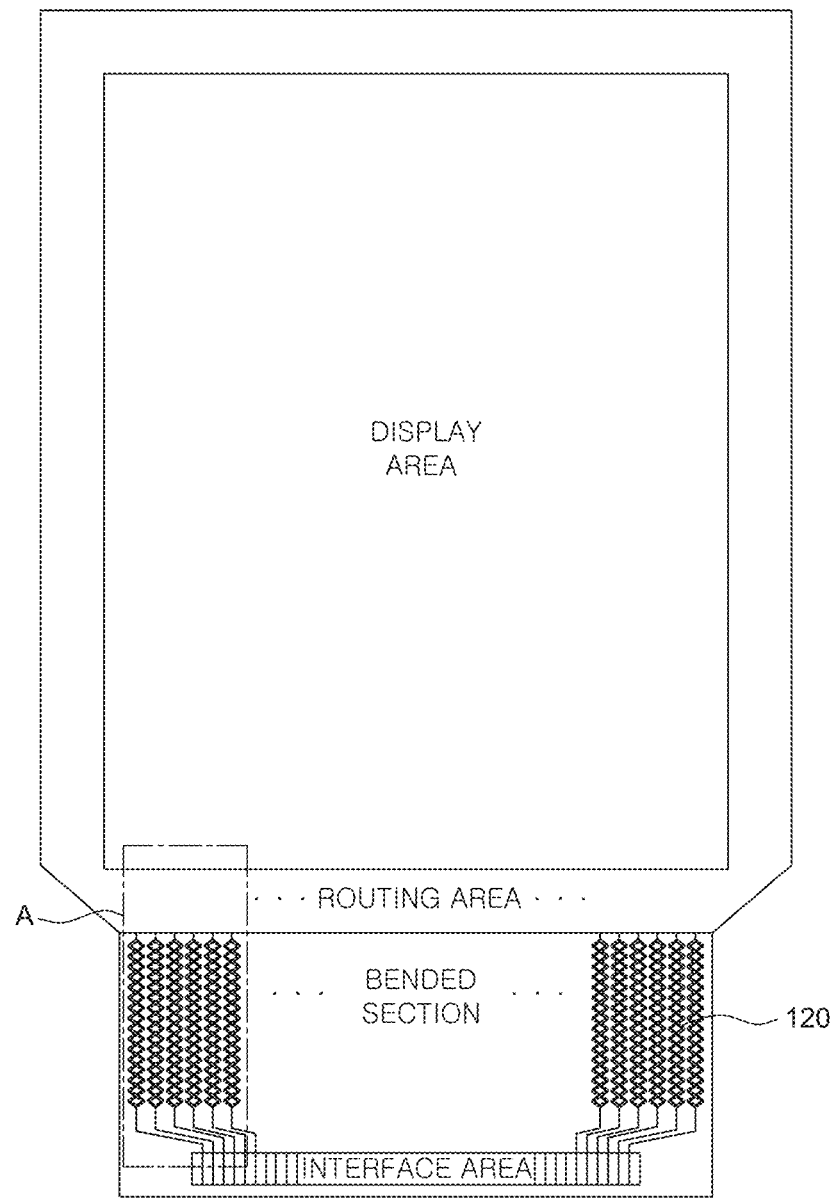
FIGS. 7A and 7B are views illustrating an electric connection between a driving circuit and a pixel.
Figure 7B:
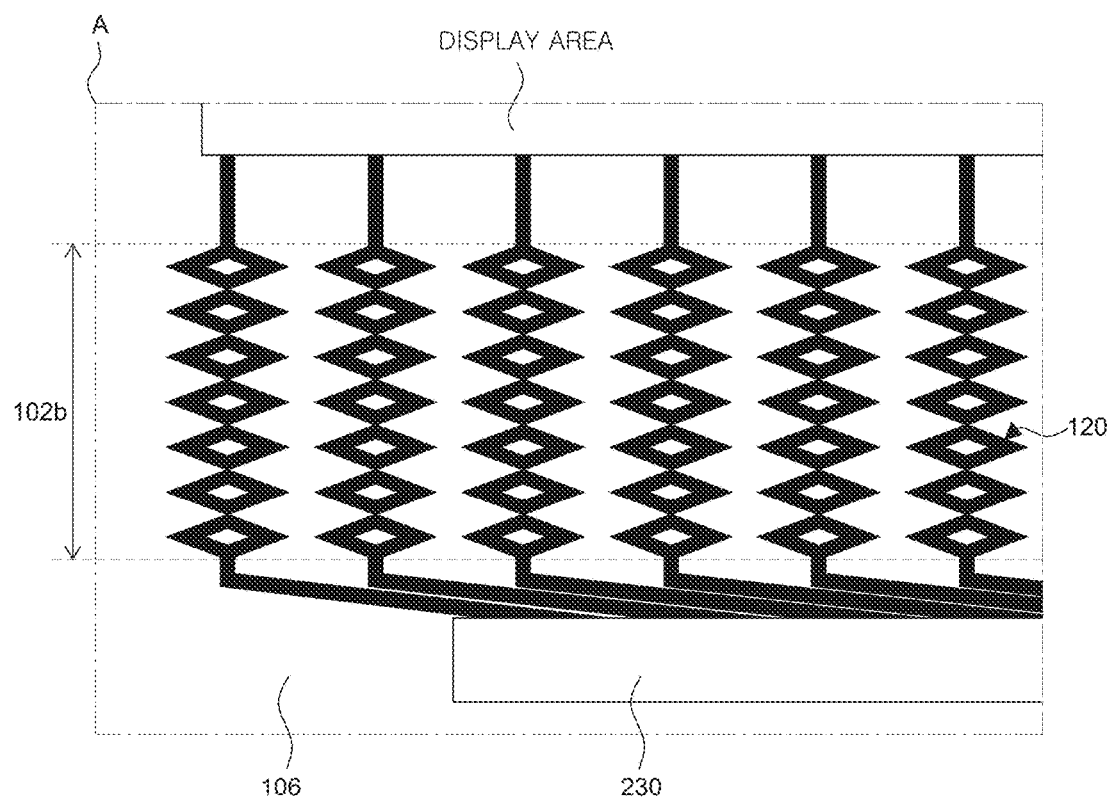

FIGS. 7A and 7B are views illustrating an electric connection between a driving circuit and a pixel.

In FIG. 7A, a conductive line 120 having a strain reducing design which is disposed in the bended section is illustrated. The illustrated conductive lines 120 are conductive lines to which a diamond shaped strain reducing design described with reference to FIG. 6 is applied. The conductive lines 120 may be traces which transfer a control signal generated in the driving circuit to the pixel. In this case, the driving circuit is located in an interface area or is mounted on the circuit board to be connected to the interface area. In the meantime, the conductive lines 120 pass through a routing area to be connected to the pixel circuit in an upper direction and are connected to the driving circuit in the lower direction.

FIG. 7B is a view enlarging one part A of FIG. 7A. As illustrated in FIG. 7B, the conductive line 120 having a strain reducing structure which is disposed to cross the bended section 102b may be connected to the driving circuit 230. The driving circuit may be a data driving circuit, a gate driving circuit, and a touch driving circuit. Alternatively, the conductive line 120 may be connected to the driving circuit mounted on the circuit board through a connecting interface (a pad, a bump, or a pin). Left and right widths of the conductive line, a shape/size of a pattern shape (for example, a diamond), a pitch between conductive lines may be designed in accordance with the characteristic of the display device. For example, a display device (for example, a small display device) having a relatively small number of pixels requires a small number of data lines, so that the conductive line pitch may be designed to be relatively wide. In this case, since a degree of freedom of design is high, an expanding angle of the diamond shape may be designed to be larger or the width of each conductive line (data line) may be designed to be thicker.

In a large-area/high-resolution display device in recent years, the number of conductive lines (gate lines or data lines) necessary for transferring control information is greatly increased. Accordingly, there are several restrictions to design a trace for reducing a strain as illustrated in FIG. 7. Specifically, in order to dispose a large number of conductive lines in a limited space, the pitch between conductive lines needs to be narrowed. In this case, since the diamond shaped strain reducing design illustrated in FIGS. 6 and 7 has a large left and right width, it is difficult to apply the diamond shaped strain reducing design illustrated in FIGS. 6 and 7 to the narrow pitch.

Figure 8:
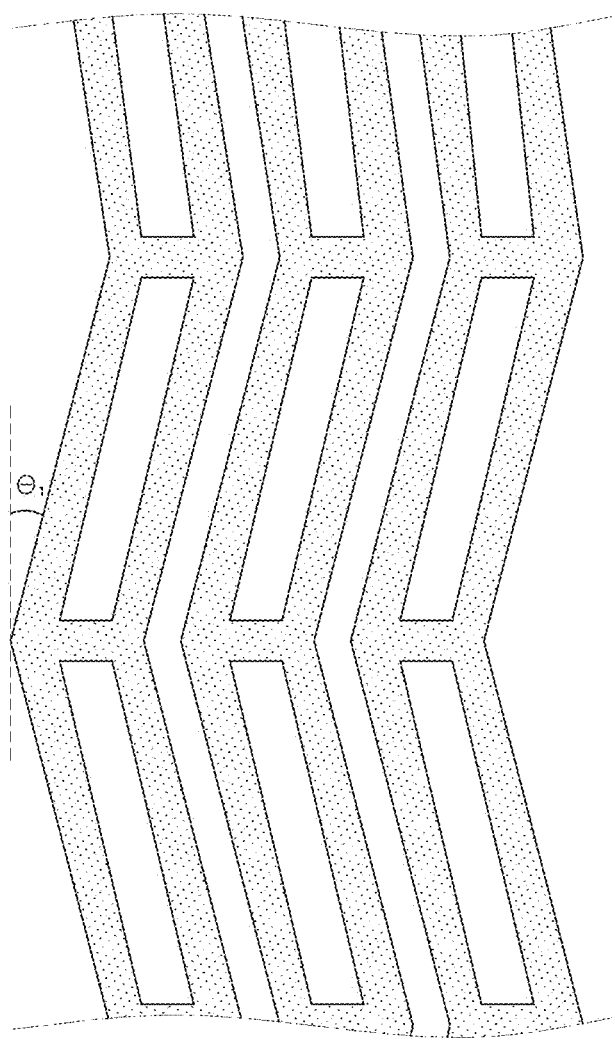
FIG. 8 is a view illustrating a conductive line having a strain reducing design which is different from that of FIG. 7.

FIG. 8 is a view illustrating a conductive line having a strain reducing design which is different from that of FIG. 7.

A conductive line layout structure illustrated in FIG. 8 is a strain reducing structure (pattern) designed in a parallelogram shape instead of a diamond shape, which is designed in consideration of a narrow conductive line pitch. The conductive line to which the strain reducing structure is applied extends so as not to be parallel to the bending direction in order to distribute stress applied at the time of bending. That is, the conductive line 120 extends with a zigzag pattern at a particular angle with respect to the bending direction. Further, the conductive line is configured by two sub traces connected to each other. In FIG. 8, three conductive lines in which two sub traces are paired so as to form respective conductive lines are illustrated. According to the above-described structure, when one sub trace is damaged, the remaining sub trace may serve as a preliminary path.

In spite of the layout design, difficulty caused by the narrow space where the conductive lines are disposed still remains. An angle θ1 of the extending direction of the conductive line with respect to the bending direction is one which is smaller than an angle θ2 in the design structure which will be described below with reference to FIG. 9A. This is because the smaller the angle θ1 with respect to the bending direction, the lower the ability to withstand a stress. The disadvantage may cause damage (e.g., cracks) to the conductive line due to the bending to result in electrical and mechanical failure.

Figure 9A:
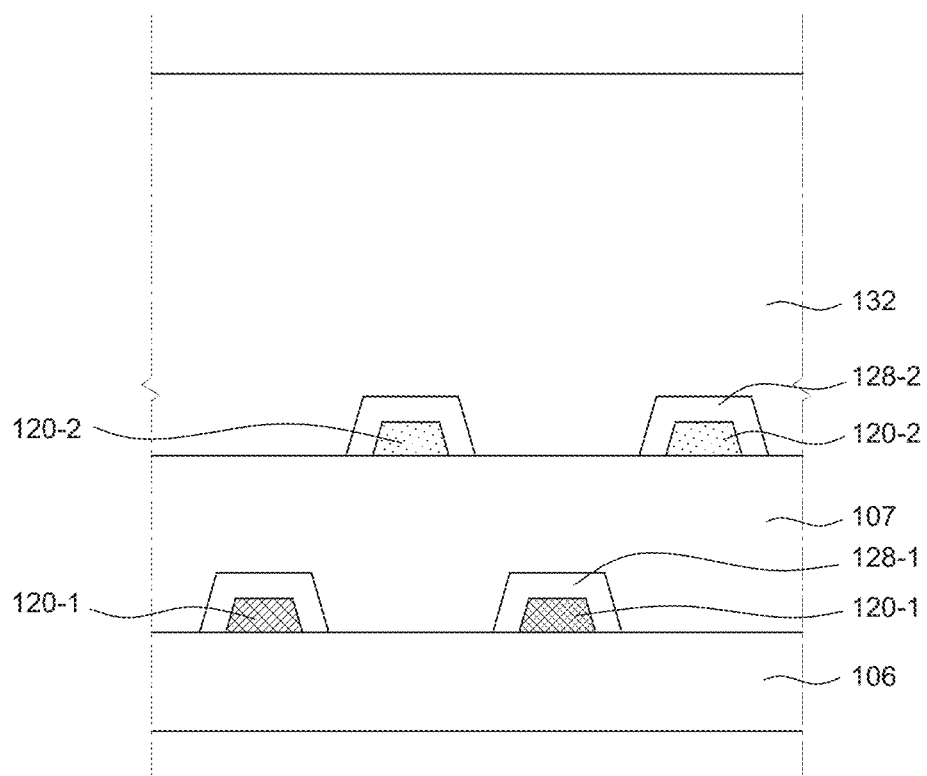
FIGS. 9A and 9B are views illustrating a strain reducing conductive line design according to an embodiment of the present disclosure.
Figure 9B:
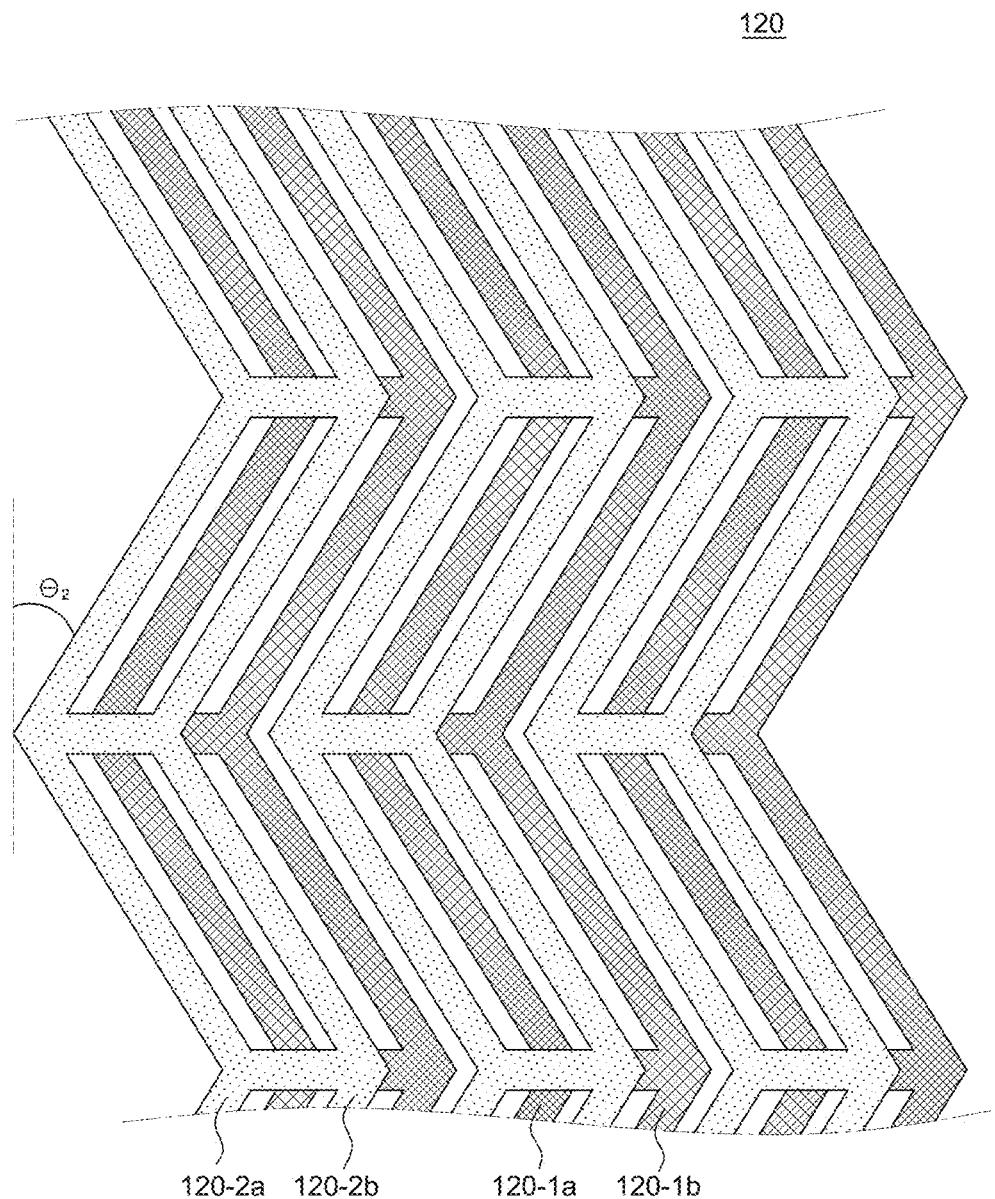

FIGS. 9A and 9B are views illustrating a strain reducing conductive line design according to an embodiment of the present disclosure.

A design for compensating the disadvantage of the conductive line design illustrated in FIG. 8 is applied to the conductive lines illustrated in FIGS. 9A and 9B. That is, the conductive lines disposed in the bended section according to an embodiment of the present disclosure have a multilayered (multi plane) structure to avoid a spatial restriction. FIG. 9A is a cross-sectional view of the conductive line structure and FIG. 9B is a plan view of the conductive line structure.

In FIGS. 9A and 9B, conductive lines 120-1 and 120-2 which are disposed on two layers (planes) are illustrated. Each of the conductive lines include two sub traces 120-1a and 120-1b and 120-2a and 120-2b. The first conductive line 120-1 is disposed on a first layer and the second conductive line 120-2 is disposed on a second layer. For example, the first conductive line 120-1 is located on the base layer 106, the insulating layer 107 is located over the first conductive line 120-1, and the second conductive line 120-2 is located on the insulating layer 107. The conductive lines (or the sub traces) may be covered by the protective layers 128-1 and 128-2 and the insulating layer 107 is disposed between the first conductive line 120-1 and the second conductive line 120-2. The insulating layer 107 may be configured by an inorganic layer or an organic layer such as photo acryl and provide an electrical insulation between the first conductive line 120-1 and the second conductive line 120-2. The thickness of the insulating layer 107 may be determined in consideration of coupling between adjacent conductive lines. When the insulating layer 107 is configured by the same material (for example, photo acryl) as the planarization layer in the display area, the insulating layer may be formed by the same process. In the meantime, a buffer layer may be provided below the first conductive line 120-1 and/or the second conductive line 120-2.

The sub traces of the first conductive line 120-1 and the second conductive line 120-2 may extend to be parallel to each other. Referring to FIG. 9B, it is understood that each of the first conductive line 120-1 and the second conductive line 120-2 is configured by two sub traces and the sub traces are parallel to each other. Further, the sub traces may be formed such that a portion extending in a first direction (for example, a left downward ( ✓ ) direction) and a portion extending in a second direction (for example, a right downward ( ╲ ) direction) are alternately connected. The first conductive line 120-1 and the second conductive line 120-2 may include a joint which connects different sub traces at a portion (from the first direction to the second direction and/or from the second direction to the first direction) where directions extending the sub traces are changed. The sub traces are gathered at one conductive line at the start and end portions. According to another aspect, one conductive line is divided into two sub traces at the start and end portions.

A protective coating layer 132 may be disposed above the second conductive line 120-2. When several layers are not provided in a bent portion of the flexible display device 100, a protective layer may be necessary for conductive lines, specifically, wire traces in the bended section. Further, since an inorganic insulating layer may be etched at the bent portion of the flexible display device 100, conductive lines of the bent portion may be susceptible to moisture or other foreign matters. Specifically, various pads and conductive lines for testing components during the manufacturing process of the flexible display device 100 may be chamfered, which may remain a conductive line extending to a dug edge of the flexible display device 100. The conductive lines may be easily corroded by moisture and the corrosion may expand to adjacent conductive lines. Accordingly, a protective coating layer which may also be referred to as a "micro-coating layer" may be provided on the conductive line and/or the wire trace of the bent portion.

The protective coating layer 132 may be coated on a bended section with a thickness which is determined to adjust a neutral plane of the flexible display device 100 in the bent portion. A thickness added to the protective coating layer 132 in the bent portion may move the plane of the conductive line and/or the wire trace to be closer to the neutral plane.

Since two conductive lines which are adjacent to each other on the plane are disposed to be divided onto the upper and lower layers as illustrated in FIGS. 9A and 9B, a sufficient interval between the adjacent conductive lines is provided, so that interference may be reduced. Therefore, a degree of freedom of a conductive line layout design is increased. Therefore, in the conductive line layout design of FIG. 9B, the conductive lines may obliquely extend at a larger angle ($\theta 2 > \theta 1$) with respect to the bending direction as compared with a design of FIG. 8. This structure has a stronger characteristic for the bending stress.

Figure 10A:
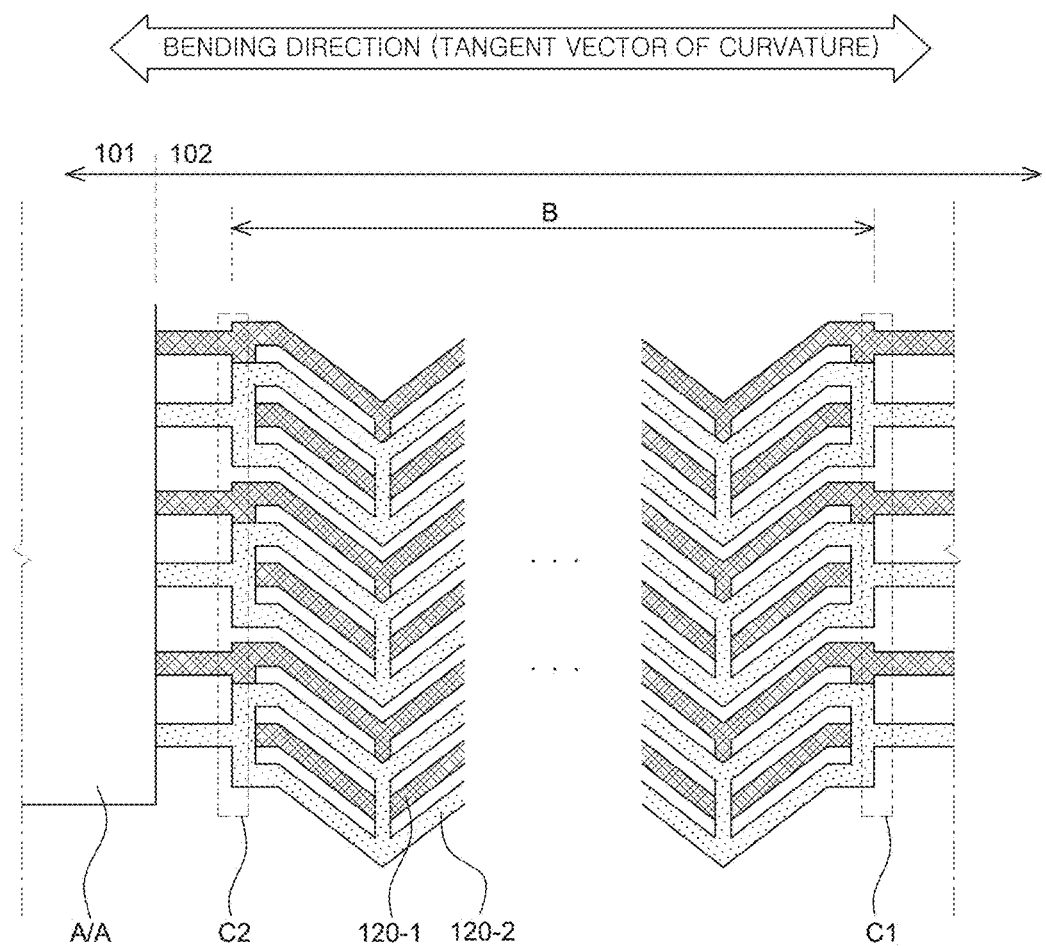
FIGS. 10A to 10C are views illustrating a flexible display device according to an embodiment of the present disclosure and a part of an implementing process of a strain reducing conductive line design applied thereto.
Figure 10B:
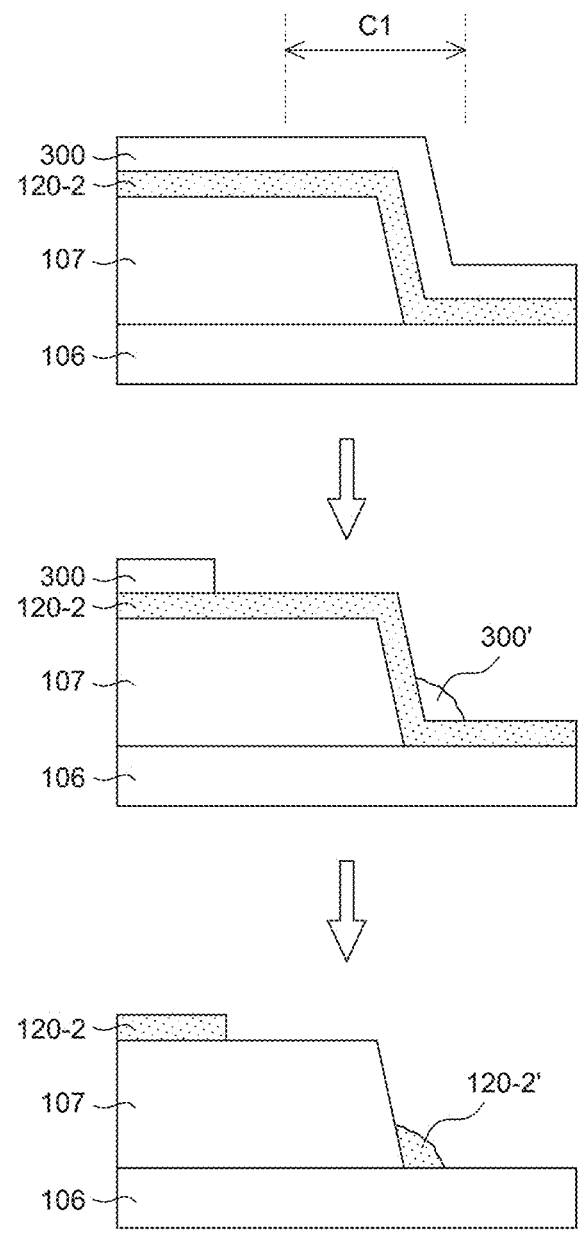
Figure 10C:
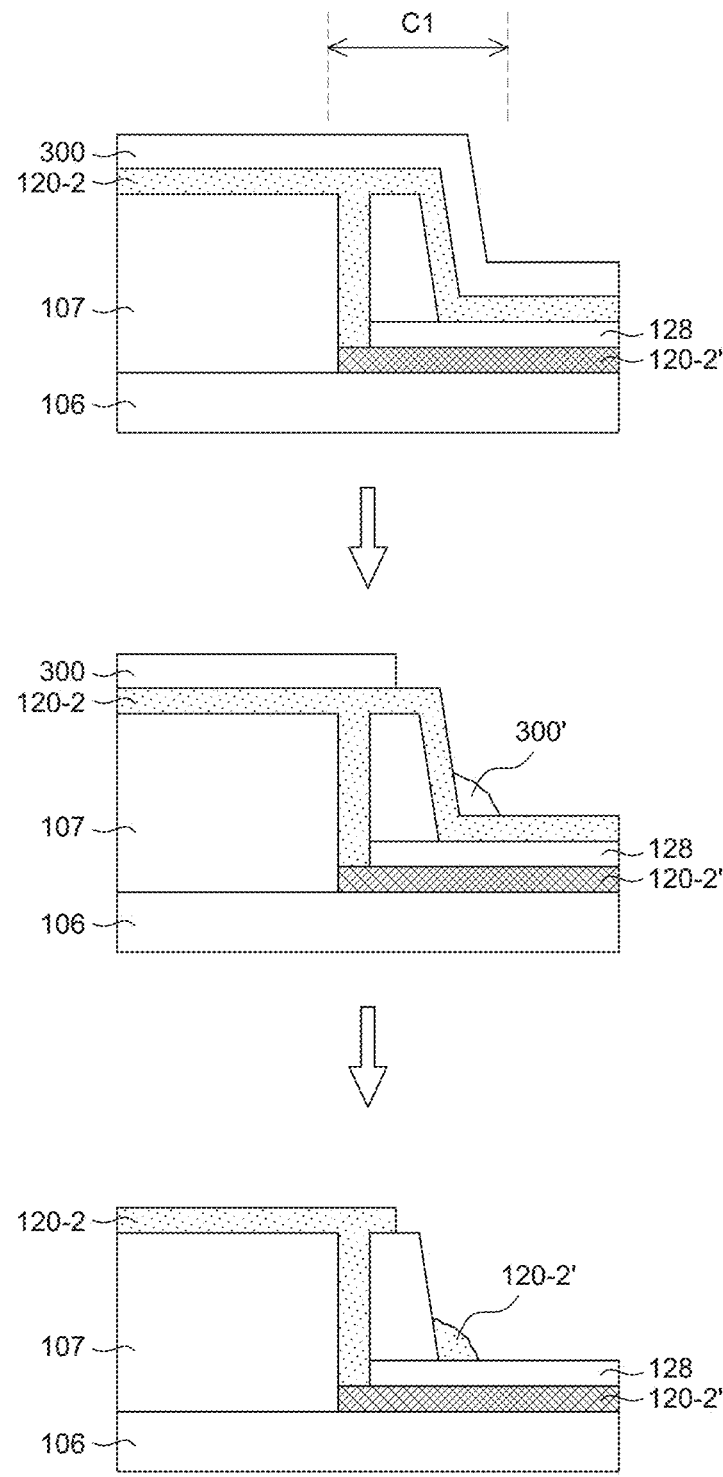

FIGS. 10A to 10C are views illustrating a flexible display device according to an embodiment of the present disclosure and a part of an implementing process of a conductive line design applied thereto.

The flexible display device may include a base layer 106, a polarization layer 110, a protective coating layer 132, and a printed circuit board. If necessary, the flexible display device may further include a support layer 108 which supports the base layer 106 and a supporting member (for example, a mandrel). When the base layer 106 is formed of plastic, the base layer may also be referred to as a plastic film or a plastic substrate. For example, the base layer 106 may be a film type layer including one selected from a group consisting of a polyimide based polymer, a polyester based polymer, a silicon based polymer, an acrylic polymer, a polyolefin based polymer, and a copolymer thereof. Among these materials, polyimide may be applied to a high temperature process and may be coated and thus is widely used for a plastic substrate.

The base layer 106 of the flexible display device may include a first portion 101 and a second portion 102. In FIGS. 3A, 4, and 10A, it is illustrated that the second portion 102 extends to the outside of the first portion 101, but the spirit of the present disclosure is not limited thereto. The first portion 101 includes a display area A/A in which the organic light emitting diode and the polarization layer 110 are disposed. In this case, the organic light emitting diode and the polarization layer 110 are disposed on a first surface (a top surface) of the first portion 101. In the organic light emitting diode, a first electrode, an organic light emitting layer, and a second electrode are sequentially disposed. That is, the organic light emitting diode may be configured by the first electrode which is electrically connected to the driving thin film transistor (driving TFT), the organic light emitting layer which is disposed on the first electrode, and the second electrode which is disposed on the organic light emitting layer. An encapsulation layer is disposed on the organic light emitting diode and the polarization layer 110 may be located on the encapsulation layer. An adhesive layer is disposed on the polarization layer 110, and a cover layer (for example, a cover glass) may be disposed thereon.

In the meantime, the second portion 102 may be a non-display area at the outside of the first portion and has a portion (a bended section) which is bent toward a second surface (a lower surface, an opposite side to the first surface) of the first portion 101. In this case, the second portion 102 may be provided to extend to the outside of the first portion 101. The second portion 102 may include a bended section 102b which is bent at a predetermined curvature and a flat section (a section supported by the support layer 108) which is not bent.

Conductive lines having a strain reducing structure are disposed in a section B corresponding to the bended section. The conductive lines are connected to the pixels in the first portion (101) direction and are connected to the driving circuit (a data driving circuit and a gate driving circuit) in the second portion (102) direction.

The B section may be the same as the bended section. However, if necessary, the B section may be slightly larger than or smaller than the bended section.

Hereinafter, it is assumed that the B section is the same as the bended section, but the spirit of the present disclosure is not limited thereto. In the B section, conductive lines 120-1 and 120-2 may be disposed on two or more layers. The conductive lines extend in a direction which is not parallel to a bending direction (a bending direction and a tangent vector of the curvature) of the bended section. As described above, this is to minimize the stress applied to the conductive lines due to the bending.

The conductive lines 120-1 and 120-2 in the bended section are disposed on two layers as illustrated in FIG. 9A. In this case, the conductive lines include a first conductive line 120-1 on a first layer and a second conductive line 120-2 on a second layer and an insulating layer is located between the first conductive line 120-1 and the second conductive line 120-2. The first layer may be the base layer 106 and the second layer may be the insulating layer 107. That is, the first conductive line 120-1 may be disposed on the base layer and the second conductive line 120-2 may be disposed on the insulating layer. In the meantime, a first protective layer which covers the first conductive line, a second protective layer which covers the second conductive line, and a protective coating layer which covers the second protective layer and the insulating layer may be further provided.

Each of the first conductive line 120-1 and the second conductive line 120-2 may include two or more sub traces. In this case, the sub traces may extend to be parallel to each other. Referring to FIG. 10A, it is understood that each of the first conductive line 120-1 and the second conductive line 120-2 is configured by two sub traces in a B section and the sub traces are parallel to each other. Further, the sub traces may be formed such that a portion extending in a first direction (for example, a left downward (✓) direction) and a portion extending in a second direction (for example, a right downward (↘) direction) are alternately connected. The first conductive line 120-1 and the second conductive line 120-2 may include a joint (bridge) which connect different sub traces at a portion (from the first direction to the second direction or from the second direction to the first direction) where directions extending the sub traces are changed. By means of the connection, when one sub trace is damaged, the remaining sub trace may function as a preliminary path. The sub traces are gathered at an end portion (C1 and/or C2) of the insulating layer as one conductive line. According to another aspect, one conductive line is divided into two sub traces at the C1 and/or C2.

The insulating layer may be provided only in a section where the conductive lines are made of a plurality of layers. In FIG. 10A, the insulating layer may be provided only in the B section. In this case, the first conductive line 120-1 is disposed on the first layer and the second conductive line 120-2 is disposed on the second layer in the bended section B and is disposed on the first layer in a section other than the bended section. That is, in the first conductive line 120-1, the sub trace and a routing trace (a trace connecting the sub trace and the pixel/driving circuit) are disposed on the first layer (for example, a base layer). In contrast, in the second conductive line 120-2, the sub trace is disposed on the second layer (for example, on the insulating layer) and the routing trace is disposed on the first layer. This design is designed because the sub trace is a redundancy structure and occupies a wider space.

The above-described design is illustrated in FIGS. 10B and 10C. As seen from the drawings, an upper trace and a lower trace are connected at an end C1 of the insulating layer 107. In FIG. 10B, the second conductive line 120-2 is formed to rise along a side wall of the insulating layer 107. In this case, when the photo resist 300 is not completely removed in some areas during the patterning process so that a remaining film 300' remains, a part 120-2' of the conductive line which needs to be etched remains in that portion to cause failure (for example, a short circuit between adjacent lines).

In order to avoid the above-described problem, the sub trace 120-2 of the second conductive line and the routing trace 120-2' may be connected as illustrated in FIG. 10C. That is, in the second conductive line, a portion 120-2 disposed on the second layer and a portion 120-2' disposed on the first layer are connected through a contact hole which passes through the insulating layer 107. In this case, the insulating layer 107 encloses the contact hole. In the above-described connection, even though the above-described remaining film 300' and the metallic residue 120-2' are generated, a risk of a short circuit between adjacent lines is reduced by the insulating layer 107 and the protective layer 128. The portion 120-2' disposed on the first layer may be formed of the same material as the first conductive line 120-1 by the same process. Further, the portion 120-2' disposed on the first layer may be configured by a different material from the portion 120-2 disposed on the second layer.

The embodiments of the present disclosure can also be described as follows:

According to an aspect of the present disclosure. The flexible display device includes a base layer including a first portion in which an organic light emitting diode is disposed on a first surface and a second portion which has a bended section bent toward a second surface opposite to the first surface at the outside of the first portion; and conductive lines in the bended section, the conductive lines being disposed two or more layers, wherein the conductive lines extend in a direction which is not parallel to a bending direction of the bended section.

The conductive lines may include a first conductive line on a first layer and a second conductive line on a second layer and an insulating layer may be located between the first conductive line and the second conductive line.

The first conductive line may be disposed on the base layer and the second conductive line may be disposed on the insulating layer.

The flexible display device may further include a first protective layer covering the first conductive line, a second protective layer covering the second conductive line, and a protective coating layer covering the second protective layer and the insulating layer.

Each of the first conductive line and the second conductive line may include two or more sub traces and the sub traces extend to be parallel to each other.

The sub traces may be formed such that a portion extending to a first direction and a portion extending to a second direction are alternately connected.

The first conductive line and the second conductive line may include joints connecting different sub traces at a portion where the extending directions of the sub traces are changed.

The sub traces may be gathered at an end portion of the insulating layer as one conductive line.

The first conductive line may be disposed on the first layer and the second conductive line may be disposed on the second layer in the bended section and disposed on the first layer in a section other than the bended section.

In the second conductive line, a portion disposed on the second layer and a portion disposed on the first layer may be connected at an end of the bended section.

In the second conductive line, the portion disposed on the second layer and the portion disposed on the first layer may be connected through a contact hole which passes through the insulating layer.

The contact hole may be enclosed by the insulating layer.

Although the exemplary embodiments of the present disclosure have been described in detail with reference to the accompanying drawings, the present disclosure is not limited thereto and may be embodied in many different forms without departing from the technical concept of the present disclosure. Accordingly, the embodiments disclosed herein are intended to not limit but describe the technical aspects of the present disclosure and the scope of the present disclosure is not restricted by the embodiments. The features of various embodiments of the present disclosure can be partially or entirely bonded to or combined with each other and can be interlocked and operated in technically various ways by those skilled in the art, and the embodiments can be carried out independently of or in association with each other. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A flexible display device, comprising:
    a base layer including a first portion in which an organic light emitting diode is disposed on a first surface and a second portion which has a bended section bent toward a second surface opposite to the first surface at the outside of the first portion;
    conductive lines in the bended section, the conductive lines having portions that extend in a direction which is not parallel to a bending direction of the bended section, the conductive lines including a first conductive line on the base layer and a second conductive line on the first conductive line only at selected locations; and
    an insulating layer located between the first conductive line and the second conductive line, and
    wherein the second conductive line is disposed on the insulating layer in the bended section and disposed on the base layer in a section other than the bended section, and wherein in the second conductive line, a portion disposed on the base layer and a portion disposed on the insulating layer are connected through a contact hole which passes through the insulating layer at an end of the bended section.

2. The flexible display device according to claim 1, further comprising:
a first protective layer covering the first conductive line;
a second protective layer covering the second conductive line; and
a protective coating layer covering the second protective layer and the insulating layer.

3. The flexible display device according to claim 1, wherein each of the first conductive line and the second conductive line includes two or more sub traces, and the sub traces extend to be parallel to each other.

4. The flexible display device according to claim 3, wherein the sub traces are formed such that a portion extending to a first direction and a portion extending to a second direction are alternately connected.

5. The flexible display device according to claim 3, wherein the first conductive line and the second conductive line include joints connecting different sub traces at a portion where the extending directions of the sub traces are changed.

6. The flexible display device according to claim 3, wherein the sub traces are gathered at an end portion of the insulating layer as one conductive line.

7. The flexible display device according to claim 1, wherein the contact hole is enclosed by the insulating layer.

8. The flexible display device according to claim 7, wherein the insulating layer reduces a risk of a short circuit between adjacent lines caused by remaining film and metallic residue.

9. The flexible display device according to claim 1, wherein a thickness of the insulating layer is determined in consideration of coupling between adjacent conductive lines.

10. The flexible display device according to claim 1, further comprising a buffer layer provided below at least one of the first conductive line and the second conductive line.

11. The flexible display device according to claim 1, further comprising a support layer and a supporting member that support the base layer.

12. The flexible display device according to claim 1, wherein a portion on the base layer in the second conductive layer is formed of the same material as the first conductive line.

13. The flexible display device according to claim 1, wherein the portion on the base layer in the second conductive layer is configured by a different material from the portion on the insulating layer.

* * * * *